US011119692B2

(12) United States Patent
Kim et al.

(10) Patent No.: US 11,119,692 B2
(45) Date of Patent: Sep. 14, 2021

(54) STORAGE DEVICE HAVING WIDE INPUT/OUTPUT AND METHOD OF OPERATING THE SAME

(71) Applicant: SAMSUNG ELECTRONICS CO., LTD., Suwon-si (KR)

(72) Inventors: Hyeonwu Kim, Gyeongsangbuk0do (KR); Daekyoung Kim, Seoul (KR); Seok-Won Ahn, Suwon-si (KR); Chanho Yoon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 121 days.

(21) Appl. No.: 16/510,029

(22) Filed: Jul. 12, 2019

(65) Prior Publication Data

US 2020/0150893 A1  May 14, 2020

(30) Foreign Application Priority Data

Nov. 9, 2018 (KR) .......................... 10-2018-0137034

(51) Int. Cl.
*G06F 3/06* (2006.01)
*G11C 16/32* (2006.01)
*G11C 16/08* (2006.01)
*G11C 16/04* (2006.01)

(52) U.S. Cl.
CPC .......... *G06F 3/0655* (2013.01); *G06F 3/0604* (2013.01); *G06F 3/0679* (2013.01); *G11C 16/32* (2013.01); *G11C 16/0483* (2013.01); *G11C 16/08* (2013.01)

(58) Field of Classification Search
CPC .... G06F 3/0655; G06F 3/0679; G06F 3/0604; G06F 2212/7202; G06F 2212/1041; G06F 12/0246; G11C 16/32; G11C 16/08; G11C 16/0483; G11C 16/10; G11C 7/22; G11C 8/18
USPC ......................................... 711/154
See application file for complete search history.

(56) References Cited

U.S. PATENT DOCUMENTS

| 8,250,297 | B2 | 8/2012 | Gillingham et al. |
| 8,364,881 | B2 | 1/2013 | Urabe |
| 8,634,881 | B2 | 1/2014 | Alpert et al. |
| 9,659,630 | B2 | 5/2017 | Jeddeloh |
| 9,940,984 | B1 | 4/2018 | Hossain et al. |
| 2008/0061824 | A1 | 3/2008 | Chang |

(Continued)

FOREIGN PATENT DOCUMENTS

| KR | 10-2002-0058253 A | 7/2002 |
| KR | 1020020058253 | * 7/2002 |

*Primary Examiner* — Fernando Hidalgo
(74) *Attorney, Agent, or Firm* — Volentine, Whitt & Francos, PLLC

(57) ABSTRACT

A method of operating a controller which controls a nonvolatile memory device includes enabling a command latch enable signal, an address latch enable signal, and a write enable signal and transmitting multiple data signals including a command and an address to the nonvolatile memory device in synchronization with the enabled write enable signal. A number of DQ lines through which the plurality of data signals are transmitted is greater than a number of bits of each of the data signals. The method also include disabling the command latch enable signal after the command is transmitted, and disabling the address latch enable signal and the write enable signal after the address is transmitted.

20 Claims, 19 Drawing Sheets

(56) References Cited

U.S. PATENT DOCUMENTS

| | | | |
|---|---|---|---|
| 2010/0177841 A1* | 7/2010 | Yoon | H03L 7/0814 |
| | | | 375/295 |
| 2016/0036438 A1* | 2/2016 | Kim | G11C 5/063 |
| | | | 365/193 |
| 2018/0102344 A1 | 4/2018 | Ramachandra et al. | |
| 2019/0108101 A1* | 4/2019 | Wu | G06F 11/1666 |
| 2020/0372954 A1* | 11/2020 | Jeong | G11C 13/0097 |
| 2021/0055887 A1* | 2/2021 | Sugahara | G11C 16/10 |

* cited by examiner

STORAGE DEVICE HAVING WIDE INPUT/OUTPUT AND METHOD OF OPERATING THE SAME

CROSS-REFERENCE TO RELATED APPLICATIONS

This U.S. non-provisional patent application claims priority under 35 U.S.C. § 119 to Korean Patent Application No. 10-2018-0137034, filed on Nov. 9, 2018 in the Korean Intellectual Property Office, the disclosure of which is incorporated by reference herein in the entirety.

BACKGROUND

1. Field of the Disclosure

The present disclosure relates to a storage device such as a nonvolatile memory device. More particularly, the present disclosure relates to an operating method of a storage device having a wide input/output.

2. Description of the Related Art

Semiconductor memories are classified into volatile memory devices and nonvolatile memory devices. Volatile memory devices are those which lose data stored therein at power-off, and examples include a static random access memory (SRAM), a dynamic RAM (DRAM), and a synchronous DRAM (SDRAM). Nonvolatile memory devices are those which retain data stored therein even at power-off, and examples include a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), and a ferroelectric RAM (FRAM).

In a communication system, an integrated circuit (IC) and an external memory device such as random access memory (RAM) may be configured to communicate data bits in short bursts, referred to as DQ data signals, via data lines referred to as DQ lines. A transmitting device also transmits a DQS strobe signal that has corresponding bursts of clock edges along a separate bi-directional DQS line for a receiving device to properly capture the data in the DQ data signal. The receiving device uses the clock edges of the DQS strobe signal to sample and latch the data bits in the DQ data signal.

A flash memory device is widely used as a high-capacity storage medium. Various specifications exist which define operational requirements of the flash memory device. In general, DQ data signals include a command, an address, and data, and are transmitted in series. For the purposes of the present disclosure, a wide input/output for a storage device may be considered a storage device with a number of DQ lines that is greater than a number of bits of each DQ data signal in an operational requirement of a specification used for the storage device. Various issues such as reduction of performance may occur when a storage device with a wide input/output under a particular specification is used without modification.

SUMMARY

Embodiments of the present disclosure provide a solution for a problem occurring when a storage device has a wide input/output under a specification used for the storage device.

In particular, embodiments of the present disclosure provide a method of improving an operating speed of a storage device by controlling control signals used for a controller to identify a command and data.

According to an exemplary embodiment, a method of operating a controller which controls a nonvolatile memory device includes enabling a command latch enable signal, an address latch enable signal, and a write enable signal. The method also includes transmitting multiple data signals including a command and an address to the nonvolatile memory device in synchronization with the enabled write enable signal. A number of DQ lines through which the data signals are transmitted is greater than a number of bits of each of the data signals. The method also includes disabling the command latch enable signal after the command is transmitted. The address latch enable signal and the write enable signal are disabled after the address is transmitted.

According to another exemplary embodiment, a method of operating a controller which controls a nonvolatile memory device includes enabling a write enable signal. The method also includes transmitting a first control signal that indicates a command or an address directed to the nonvolatile memory device, transmitting a second control signal that indicates the command to the nonvolatile memory device and transmitting multiple data signals including the command and the address to the nonvolatile memory device in synchronization with the enabled write enable signal. A number of DQ lines through which the data signals are transmitted is greater than a number of bits of each of the data signals The method further includes disabling the second control signal after the command is transmitted and disabling the first control signal after the command and the address are transmitted.

According to yet another exemplary embodiment, a storage device includes a nonvolatile memory device and a controller. The controller enables a command latch enable signal, an address latch enable signal, and a write enable signal so as to be transmitted to the nonvolatile memory device and transmits multiple data signals including a command and an address to the nonvolatile memory device. A number of DQ lines through which the data signals are transmitted is greater than a number of bits of each of the data signals. The controller disables the command latch enable signal after the command is transmitted and disables the address latch enable signal and the write enable signal after the address is transmitted.

BRIEF DESCRIPTION OF THE FIGURES

The above and other objects and features of the present disclosure will become apparent by describing in detail exemplary embodiments thereof with reference to the accompanying drawings.

DETAILED DESCRIPTION

Below, embodiments of the present disclosure may be described in detail and clearly to such an extent that an ordinary one in the art easily implements the inventive concept(s) described herein.

Figure 1:
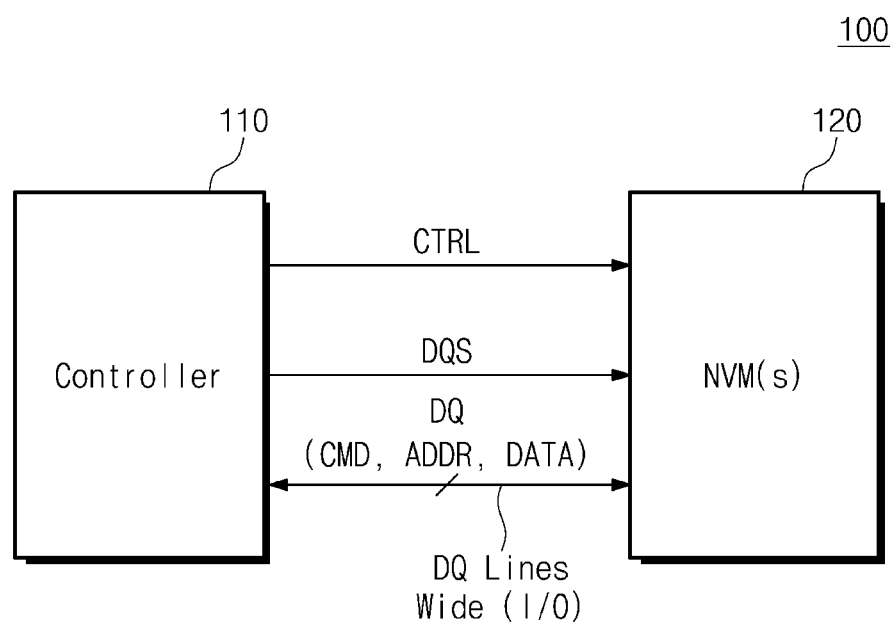
FIG. 1 illustrates a storage device according to an exemplary embodiment of the present disclosure.

FIG. 1 illustrates a storage device according to an exemplary embodiment of the present disclosure. A storage device 100 may include a controller 110 and nonvolatile memory devices 120. The nonvolatile memory devices 120 may be connected with the controller 110 through multiple channels, and two or more nonvolatile memory devices may be connected to each channel.

The controller 110 may control a read operation and a write operation of the nonvolatile memory devices 120. For example, the controller 110 may provide a command CMD, an address ADDR, and data DATA to the nonvolatile memory devices 120 by using multiple data signals DQ. The controller 110 may transmit the command CMD and the address ADDR to the nonvolatile memory devices 120 by using the data signals DQ and may receive the data DATA from the nonvolatile memory devices 120. The controller 110 may also transmit control signals CTRL and a data strobe signal DQS to the nonvolatile memory devices 120.

In an embodiment, the control signals CTRL, the data strobe signal DQS, and the data signals DQ may be transmitted to the nonvolatile memory devices 120 through signal lines that are different from each other. The control signals CTRL and the data strobe signal DQS may be used to identify the data signals DQ which are transmitted from the controller 110 to the nonvolatile memory devices 120 or are exchanged between the controller 110 and the nonvolatile memory devices 120.

In response to the received signals, the nonvolatile memory devices 120 may receive the data DATA from the controller 110 or may transmit the data DATA to the controller 110. For example, the nonvolatile memory devices 120 may determine the data signals DQ correspond to the command CMD, the address ADDR, or the data DATA of the data signals DQ, based on the control signals CTRL.

In an embodiment, the nonvolatile memory devices 120 may include a NAND flash memory. However, the present disclosure is not limited thereto. For example, the nonvolatile memory devices 120 may include, for example, at least one of volatile or nonvolatile memories such as a static random access memory (SRAM), a dynamic RAM (DRAM), a synchronous DRAM (SDRAM), a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM).

In an embodiment, the data signals DQ may be transmitted from the controller 110 to the nonvolatile memory devices 120 through DQ lines of a wide I/O. In general, the number of bits constituting each of the data signals DQ and the number of DQ lines through which the data signals DQ are transmitted may be identical. For example, each data signal composed of 8 bits is transmitted to the nonvolatile memory devices 120 through 8 DQ lines. That is, the data signals DQ are transmitted serially. However, the number of DQ lines according to an embodiment of the present disclosure may be greater than the number of bits of each data signal, and this may be referred to herein as a wide input/output. For example, the number of DQ lines may be 16, 32 or 64, but the present disclosure is not limited thereto.

According to the present disclosure, since the data signals DQ are transmitted to the nonvolatile memory devices 120 through DQ lines of the wide I/O, a time during which the data signals DQ are completely transmitted may become shorter. In addition, according to the present disclosure, a time point of a follow-up operation (e.g., transmission of the data DATA) may be advanced by controlling the control signals CTRL necessary to identify the data signals DQ, and thus, the performance of the storage device 100 may be improved. This will be described in detail later.

Figure 2:
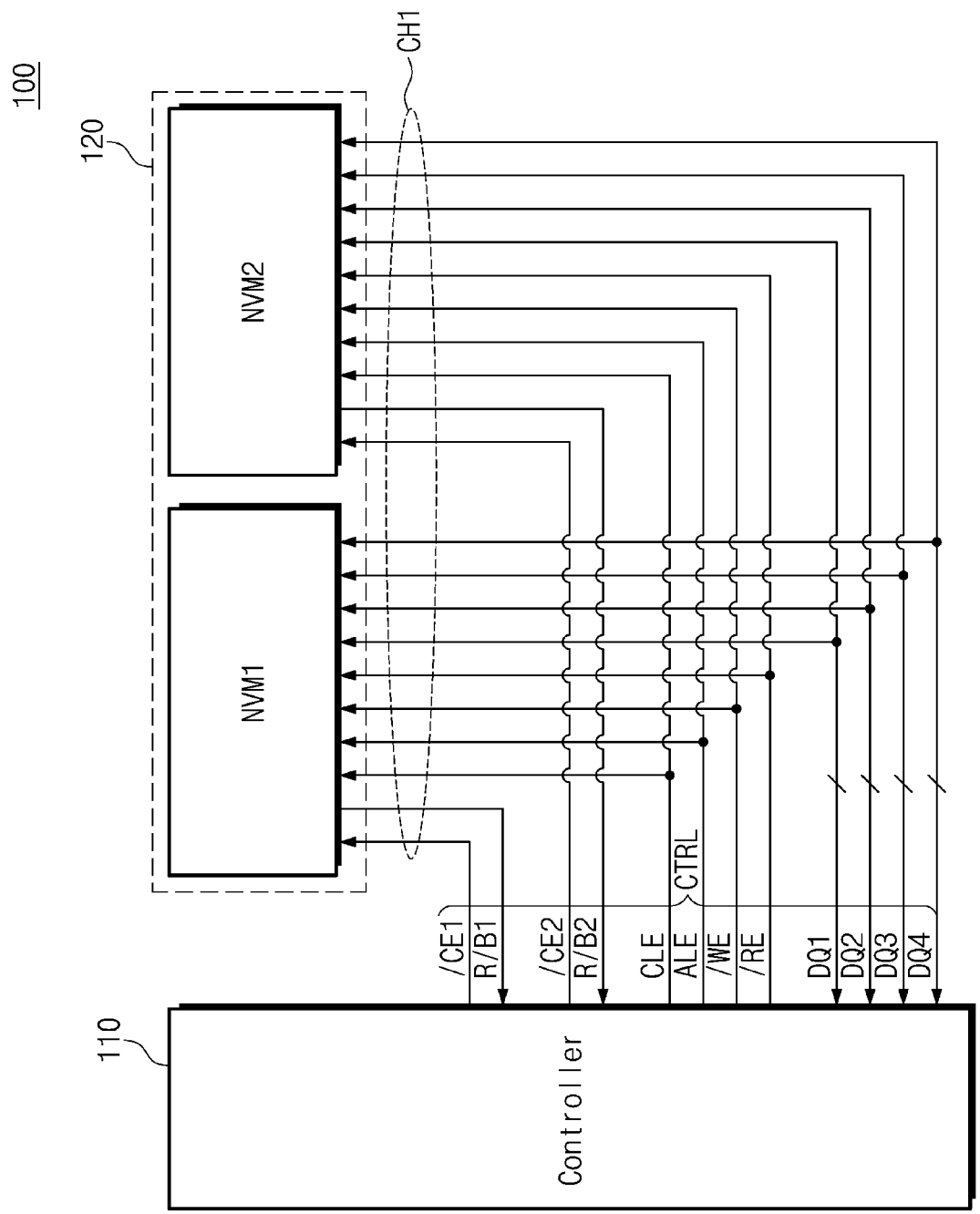
FIG. 2 illustrates an exemplary configuration of a storage device of FIG. 1 in detail.

FIG. 2 illustrates an exemplary configuration of a storage device of FIG. 1 in detail. The storage device 100 may include the controller 110 and the nonvolatile memory device 120. In an embodiment, for brevity of illustration, only one channel (hereinafter referred to as a "first channel") CH1 of multiple channels is illustrated, and only two nonvolatile memory devices (hereinafter referred to as a/the "first nonvolatile memory device NVM1" and a/the "second nonvolatile memory device NVM2") are illustrated as being connected to the first channel CH1.

The controller 110 and other controllers described herein may be a circuit with a memory that stores instructions and a processor (e.g., a microprocessor) that executes the instructions. The controller 110 may communicate with the nonvolatile memory devices NVM1 and NVM2 through the first channel CH1. For example, the controller 110 may exchange multiple data signals DQ1 to DQ4 with the first nonvolatile memory device NVM1 through the first channel CH1 by using the control signals CTRL. The controller 110 may also exchange the data signals DQ1 to DQ4 with the second nonvolatile memory device NVM2 through the first channel CH1 by using the control signals CTRL. That is, the nonvolatile memory devices NVM1 and NVM2 may share a part of the control signals CTRL and the data signals DQ1 to DQ4. The data signals DQ1 to DQ4 include the command CMD, the address ADDR, and the data DATA.

In embodiments, the control signals CTRL may include, for example, one or more of enable signals /CE1 and /CE2, ready and busy signals R/B1 and R/B2, a command latch enable signal CLE, an address latch enable signal ALE, a write enable signal /WE and/or a read enable signal /RE. The command latch enable signal CLE and other command latch enable signals described herein are used to latch a signal transmitted through DQ lines as described herein. The address latch enable signal ALE and other address latch enable signals described herein are used also to latch a signal transmitted through DQ lines as described herein. The command latch enable signals CLE and the address latch enable signals ALE are used to latch different signals, i.e., for a command "C" or for addresses such as A1 to A5.

An "enable" signal as term is used herein may be taken to mean that a corresponding function is enabled when the "enable" signal is in a particular state such as high. Enabling may therefore be taken to mean placing the "enable" signal in a particular state such as high, such that the corresponding function for the "enable" signal is enabled as a result.

The command CMD may be input in synchronization with the write enable signal /WE in an interval in which the command latch enable signal CLE is at logical high. That is, the command CMD may be latched at a rising edge of the write enable signal /WE. The address ADDR may be input in synchronization with the write enable signal /WE in an interval in which the address latch enable signal ALE is at logical high. That is, the address ADDR may be latched at rising edges of the write enable signal /WE.

Figure 3:
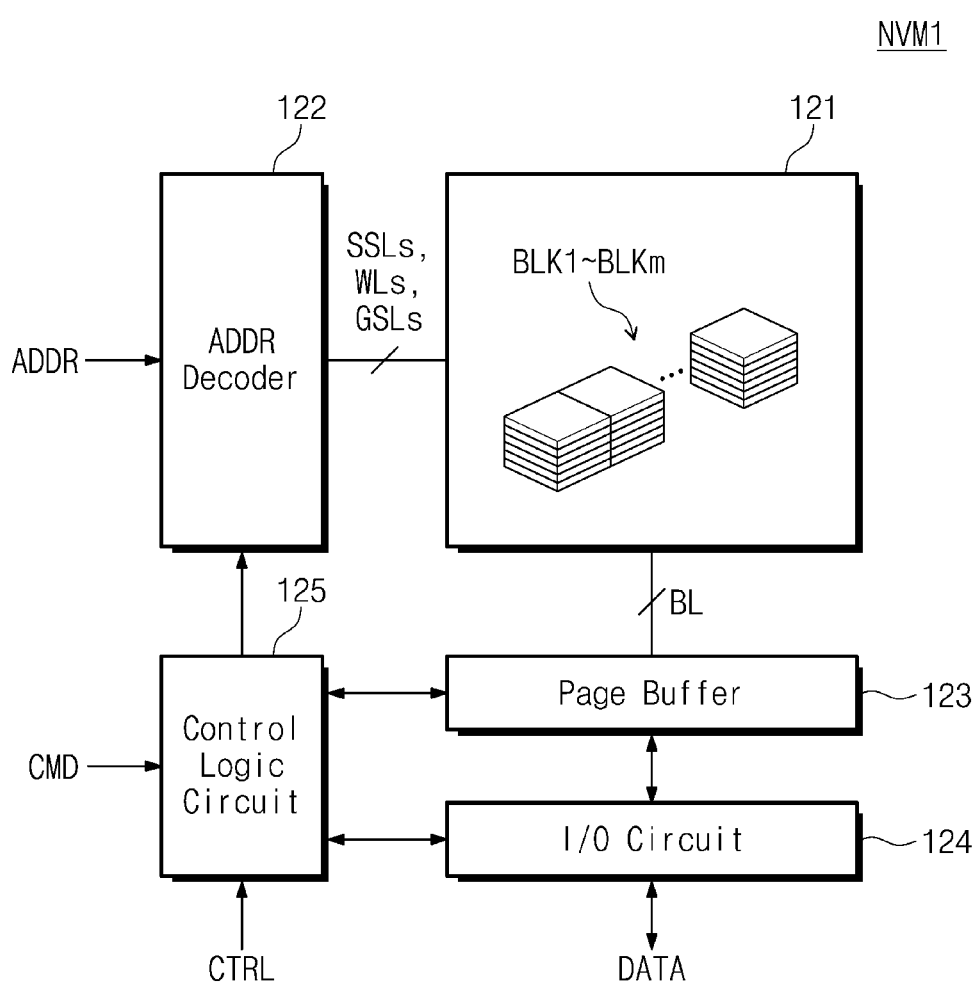
FIG. 3 illustrates an exemplary configuration of one of the nonvolatile memory devices of the storage device of FIG. 2.

FIG. 3 illustrates one of the nonvolatile memory devices NVM1 and NVM2 of the storage device of FIG. 2. In an embodiment, a configuration of the first nonvolatile memory device NVM1 is illustrated. The first nonvolatile memory device NVM1 may include a memory cell array 121, an address decoder 122, a page buffer 123, an input/output circuit 124, and a control logic circuit 125. A control logic circuit 125 may store control logic in a memory and execute the control logic with a processor such as a microprocessor or may implement control logic with circuit elements such as an application-specific integrated circuit (ASIC). References to "logic" herein refer to implementations with specific circuits and circuitry.

Before proceeding, it should be clear that FIGS. herein including FIG. 3 show and reference circuitry with labels such as "circuit", "controller" and "decoder". Such circuitry may include a processor including a microprocessor or application specific integrated circuit (ASIC) and other elements with other labels. As is traditional in the field of the inventive concept(s) described herein, examples may be described and illustrated in terms of blocks such as circuits and other elements which carry out a described function or functions. These blocks, which may be referred to herein as a circuit, a controller, a decoder or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the examples may be physically separated into two or more interacting and discrete blocks without departing from the scope of the present disclosure. Likewise, the blocks of the examples may be physically combined into more complex blocks without departing from the scope of the present disclosure.

The memory cell array 121 may include the memory blocks BLK1 to BLKm. Each of the memory blocks BLK1 to BLKm may include multiple cell strings. Each of the cell strings includes multiple memory cells. The memory cells may be connected with multiple word lines WL. Each memory cell may include a single level cell (SLC) storing one bit or a multi-level cell (MLC) storing at least two bits.

The address decoder 122 is connected with the memory cell array 121 through the word lines WL, string selection lines SSL, and ground selection lines GSL. The address decoder 122 may receive the address ADDR from the outside and may decode the received address ADDR to drive the word lines WL. For example, the address ADDR may be a physical address which is obtained by translating a logical address. The address-translating operation may be performed by a flash translation layer (FTL) which is driven by the controller 110 (refer to FIG. 1).

The page buffer 123 is connected with the memory cell array 121 through multiple bit lines BL. Under control of the control logic circuit 125, the page buffer 123 may control the bit lines BL such that the data DATA received from the input/output circuit 124 are stored in the memory cell array 121. Under control of the control logic circuit 125, the page buffer 123 may read data stored in the memory cell array 121 and may transmit the read data to the input/output circuit 124. In an embodiment, the page buffer 123 may receive data from the input/output circuit 124 in the unit of a page or may read data from the memory cell array 121 in the unit of a page.

The input/output circuit 124 may receive the data DATA from an external device and may provide the received data DATA to the page buffer 123.

The control logic circuit 125 may receive the command CMD and the control signals CTRL from the outside and control the address decoder 122, the page buffer 123, and the input/output circuit 124 in response to the receive signals CMD and CTRL. For example, the control logic circuit 125 may control any other components in response to the signals CMD and CTRL such that the data DATA are stored in the memory cell array 121. The control logic circuit 125 may control any other components in response to the signals CMD and CTRL such that the data DATA stored in the memory cell array 121 are transmitted to the external device. The control signals CTRL may be signals which the controller 110 provides to control the nonvolatile memory device NVM1.

The control logic circuit 125 may generate various voltages necessary for the nonvolatile memory device NVM1 to operate. For example, the control logic circuit 125 may generate multiple program voltages, multiple pass voltages, multiple selection read voltages, multiple non-selection read voltages, multiple erase voltages and/or multiple verification voltages. The control logic circuit 125 may provide the generated voltages to the address decoder 122 or to a substrate of the memory cell array 121.

Figure 4:
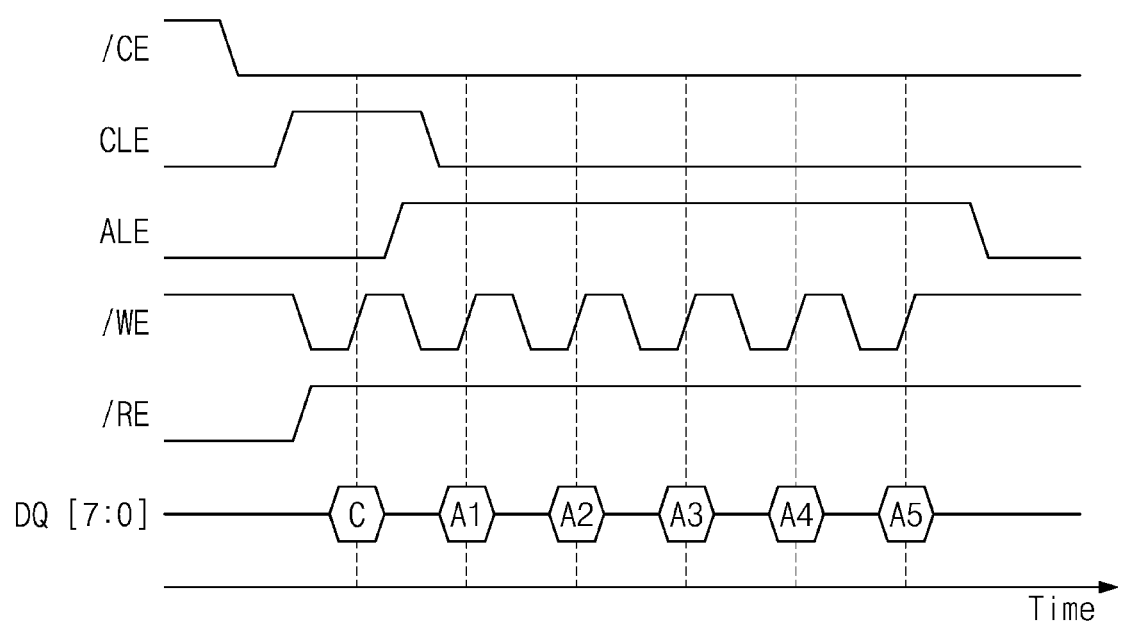
FIG. 4 is a timing diagram showing timing of signals which are input to a nonvolatile memory device.

FIG. 4 is a timing diagram showing timing of signals which are input to a nonvolatile memory device. The timing diagram of FIG. 4 is associated with the case where the number of bits constituting each of the data signals DQ and the number of DQ lines are identical. In an embodiment, it is assumed that each of the data signals DQ is an 8-bit data signal, and multiple data signals are transmitted to a nonvolatile memory device in series through 8 DQ lines. In FIG. 4, "C" indicates a command, and A1 to A5 indicate addresses. In an embodiment, A1 and A2 may indicate a column address of a memory cell array (121 in FIG. 2), and A3 to A5 may indicate a row address thereof.

A nonvolatile memory device to which the data signals DQ are to be input is selected by the chip enable signal /CE. Afterwards, the command latch enable signal CLE may transition to logical high, and the command "C" may be latched at a rising edge of the write enable signal /WE while the command latch enable signal CLE is at logical high. After the command "C" is latched, the command latch enable signal CLE may transition to logical low. Generally, the command latch enable signal CLE and other command latch enable signals described herein are used to latch a signal transmitted through a DQ line.

After the command "C" is latched, the address latch enable signal ALE transitions to logical high. In an interval in which the address latch enable signal ALE is at logical high, the addresses A1 to A5 may be latched at rising edges of the write enable signal /WE. After the addresses A1 to A5 are latched, the address latch enable signal ALE may transition to logical low. Generally, the address latch enable signal ALE and other address latch enable signals described herein are used to latch a signal transmitted through a DQ line.

According to the timing diagram illustrated in FIG. 4, since the command "C" and the addresses A1 to A5 are latched over 6 cycles, rising edges of at least six pulses of the write enable signal /WE are required. However, this count may be a minimum count necessary to identify the data signals DQ, and more rising edges of the write enable signal /WE may be required depending on a kind of a command.

Figure 5:
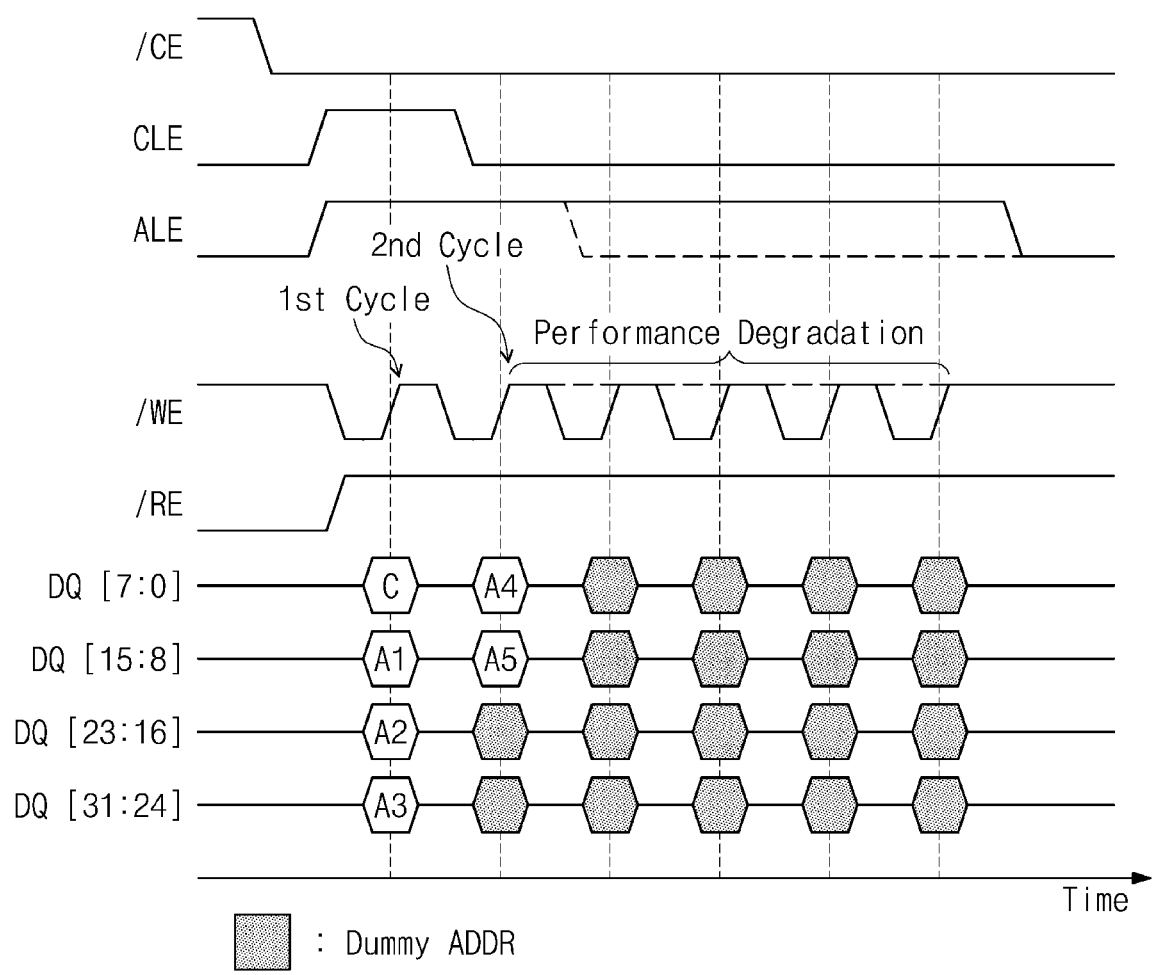
FIG. 5 is another timing diagram showing timing of signals which are input to a nonvolatile memory device.

FIG. 5 is another timing diagram showing timing of signals which are input to a nonvolatile memory device. The timing diagram of FIG. 5 is associated with the case where the number of DQ lines are greater than the number of bits constituting each of the data signals DQ (i.e., the case of a wide I/O). An embodiment is illustrated in FIG. 5 as the number of DQ lines is 32. An issue which occurs upon applying a timing rule of FIG. 4 to a storage device including DQ lines of the wide I/O will be described with reference to FIG. 5.

In the case where the command "C" is a write command, the command "C" and the addresses A1 to A5 are sequentially input to a nonvolatile memory device through the DQ lines of the wide I/O. In detail, the command "C" and the addresses A1 to A3 are input to a nonvolatile memory device at a first rising edge (i.e., a first cycle) of the write enable signal /WE. 8 bits constituting the command "C", as DQ[7:0], are input to the nonvolatile memory device through 8 DQ lines. Bits constituting the address A1, as DQ[15:8], are input to the nonvolatile memory device through 8 DQ lines. The remaining addresses A2 and A3 are input similarly to the above description.

Afterwards, the addresses A4 and A5 are input to the nonvolatile memory device at a second rising edge (i.e., a second cycle) of the write enable signal /WE. 8 bits constituting the address A4 are DQ[7:0] and are input to the nonvolatile memory device through 8 DQ lines. The address A5 is input similarly to the above description for the address A1, but now at the second rising edge of the write enable signal /WE in the second cycle.

However, if a write operation in the configuration of FIG. 5 (i.e., with 32 DQ lines) is processed according to an existing specification with a timing rule as described with reference to FIG. 4, rising edges of 6 pulses of the write enable signal /WE for identifying the command "C" and the addresses A1 to A5 would be maintained without modification. To comply with the relevant specification (e.g., Toggle DDR, ONFI, and the like), dummy data (e.g., dummy addresses) may be transmitted to the nonvolatile memory device during the remaining cycles of the write enable signal /WE as the command "C" and the addresses A1 to A5 are processed in rising edges of the write enable signal /WE in six cycles. The use of unnecessary pulses of the write enable signal /WE input to the nonvolatile memory device may cause performance degradation when fewer than six cycles are required, as shown in FIG. 5.

For example, referring to FIG. 5, only two rising edges of the write enable signal /WE in two cycles are required to identify the command "C" and the addresses A1 to A5, and the remaining four rising edges are unnecessary. As such, in the case where a controller transmits the write enable signal /WE including pulses associated with unnecessary rising edges to the nonvolatile memory device without modification, a timing of a follow-up operation (e.g., an input/output of the data DATA) is unnecessarily delayed. The above performance degradation occurs identically upon performing any other operation, such as a read operation, as well as a write operation.

To solve performance degradation occurring upon transmitting the data signals DQ through the wide I/O, a controller as described in the present disclosure controls the command latch enable signal CLE, the address latch enable signal ALE, and the write enable signal /WE. This will be described in detail later.

Figure 6:
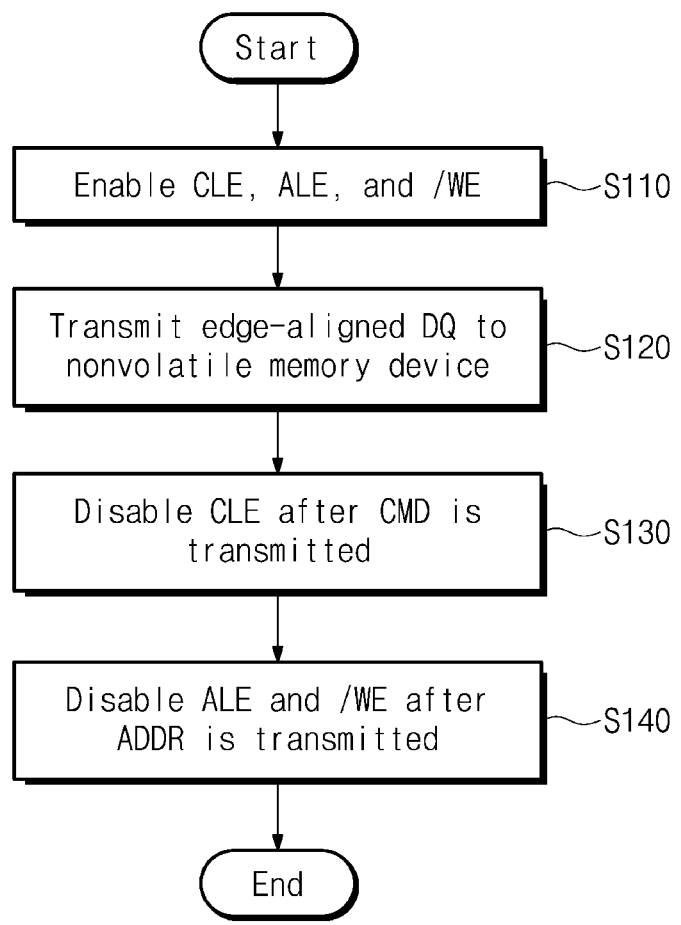
FIG. 6 illustrates an operating method of a controller which controls a nonvolatile memory device according to an exemplary embodiment of the present disclosure.

FIG. 6 illustrates an operating method of a controller which controls a nonvolatile memory device according to an exemplary embodiment of the present disclosure. To show how to solve an existing issue or to provide an improvement over an existing configuration, a description will be given through comparison with the embodiment of FIG. 5.

In operation S110, a controller may enable the command latch enable signal CLE and the address latch enable signal ALE (e.g., to logical high). In general, in the case where the controller transmits the data signals DQ in series, a nonvolatile memory device latches a command (e.g., with a command latch enable signal CLE) and then latches an address (e.g., with an address latch enable signal ALE). For this reason, the address latch enable signal ALE is not enabled when the command is latched via the command latch enable signal CLE. However, according to an embodiment of the present disclosure, the controller simultaneously transmits a command and all or part of an address to the nonvolatile memory device simultaneously or otherwise together through DQ lines that are different from each other. Therefore, the controller enables the command latch enable signal CLE and the address latch enable signal ALE at the same time.

In an embodiment, an interval in which the command latch enable signal CLE is enabled may include an interval in which the command "C" is input. However, to secure a margin, the interval in which the command latch enable signal CLE is enabled may be wider than the interval in which the command "C" is input but may be limited to a range for preventing an address from being latched at a next cycle. A time point when the command latch enable signal CLE is enabled and a time point when the address latch enable signal ALE is enabled do not need to be perfectly identical, and it is sufficient that the nonvolatile memory device may latch a command and/or an address at a first rising edge of the write enable signal /WE.

In addition, in operation S110, the controller may enable the write enable signal /WE. That the write enable signal /WE is enabled may mean that the write enable signal /WE includes a rising edge (i.e., a pulse including an edge that rises from the low level before the pulse plateaus or begins declining from the high level back towards the low level) for latching a command and/or an address.

In operation S120, the controller transmits the data signals DQ to the nonvolatile memory device through DQ lines of the wide I/O. For example, the data signals DQ may be transmitted to the nonvolatile memory device in alignment with rising edges of pulses of the write enable signal /WE. For example, the center of each data signal may be aligned with a rising edge of the write enable signal /WE.

In operation S130, the controller may disable the command latch enable signal CLE (e.g., to logical low) after the command is transmitted. An interval in which the command latch enable signal CLE is enabled may include an interval in which a command is transmitted but may be limited to a range for preventing an address from being latched at a next cycle.

In operation S140, the controller may disable the address latch enable signal ALE (e.g., to logical low) after all addresses are transmitted. For example, an interval in which the address latch enable signal ALE is enabled may include an interval in which the addresses are transmitted over two cycles as in FIG. 5.

In addition, in operation S140, the controller may disable the write enable signal /WE (e.g., to logical high) after all the addresses are transmitted. As such, pulses of the write enable signal /WE are not transmitted as much as a count defined in the existing relevant specification, and pulses of the write enable signal /WE are transmitted such that minimum rising edges necessary to latch a command and an address are secured. In other words, even though a specification may define additional pulses of the write enable signal /WE, the controller may disable the write enable signal /WE after all the addresses are transmitted given the opportunity due to the wide input/output such as in the embodiment of FIG. 6.

However, in the embodiment of FIG. 6, the controller simultaneously transmits the command "C" and the addresses A1 to A3 to the nonvolatile memory device through DQ lines that are different from each other at a first cycle. In addition, since both the command latch enable signal CLE and the address latch enable signal ALE are enabled at the first cycle of the write enable signal /WE, the nonvolatile memory device will identify the command "C" and the addresses A1 to A3 to distinguish between the command "C" and the addresses A1 to A3. Below, how to identify a command and an address will be described in detail.

Figure 7:
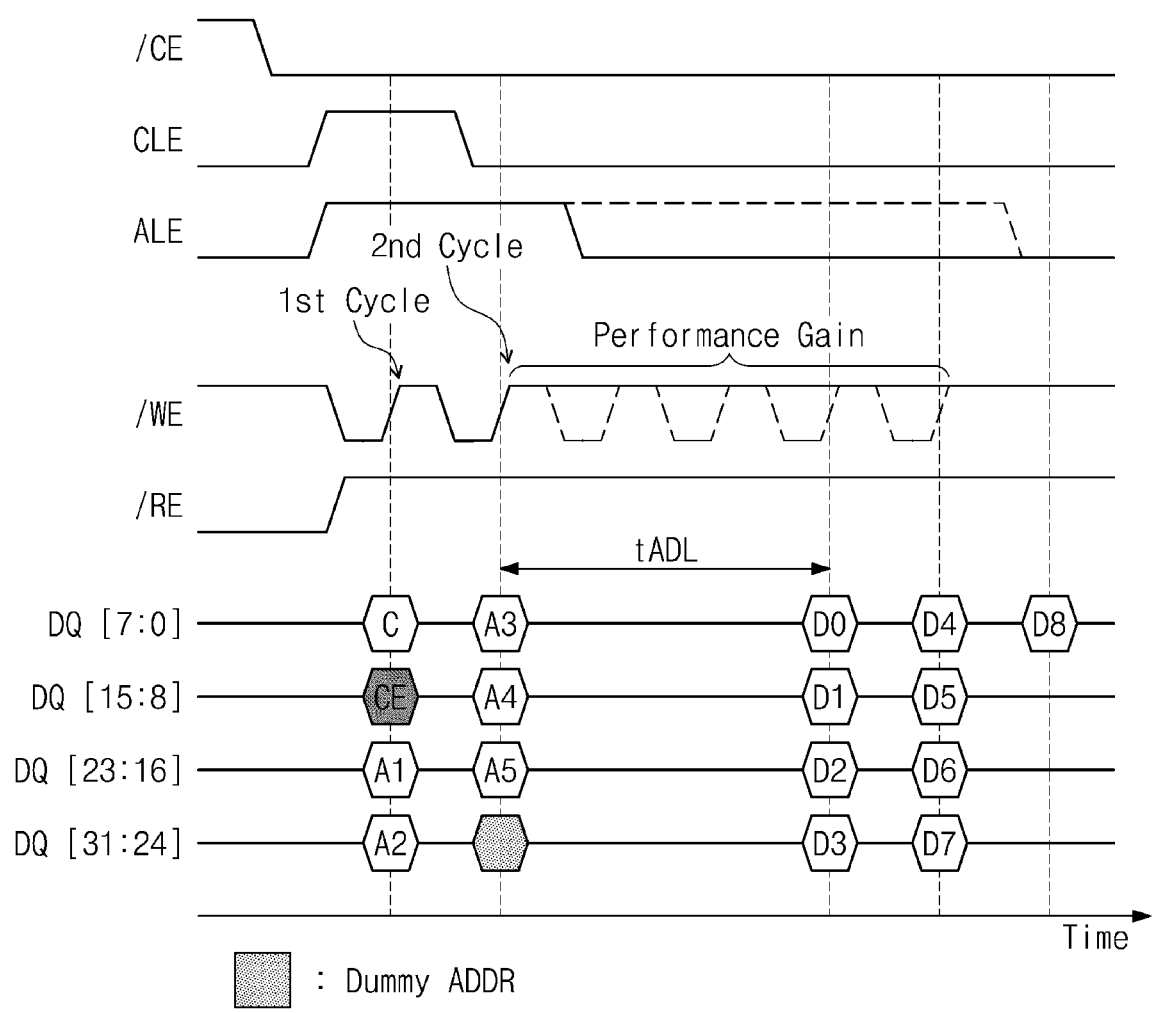
FIG. 7 is another timing diagram showing timing of signals which are input to a nonvolatile memory device according to an exemplary embodiment of the present disclosure.

FIG. 7 is another timing diagram showing timing of signals which are input to a nonvolatile memory device according to an exemplary embodiment of the present disclosure. It is assumed that the command "C" is a write command (e.g., 80h). For better understanding, a description will be given together with reference to FIG. 2.

The controller 110 may simultaneously transmit multiple data signals DQ[7:0], DQ[15:8], DQ[23:16], and DQ[31:24] to a nonvolatile memory device (e.g., NVM1) at a first cycle. The controller 110 may simultaneously transmit control signals such that the data signals DQ[7:0], DQ[15:8], DQ[23:16], and DQ[31:24] are identified by the nonvolatile memory device. For example, the data signals DQ1 to DQ4 of FIG. 2 may correspond to each of DQ[7:0], DQ[15:8], DQ[23:16], and DQ[31:24].

In an embodiment, a pair of commands (also referred to as a "command set") may be used to identify a command and an address(es) latched by the nonvolatile memory device at the same cycle. A command end signal CE indicating a transmission end of the command "C" may be transmitted to the nonvolatile memory device, together with the transmission of the command "C". In other word, a command end signal CE indicates that transmission of the command "C" ends. For example, the command "C" may be transmitted to the nonvolatile memory device through relevant DQ lines as DQ[7:0]. The command end signal CE may be transmitted to the nonvolatile memory device through relevant DQ lines as DQ[15:8]. The command end signal CE is added in the embodiment of FIG. 7 compared to the embodiment of FIG. 6 and provides for distinguishing between the command "C" and the address without necessarily increasing the number of cycles required for transmission overall. In FIG. 6, the command "C" and the address are still transmitted in two cycles, even with the addition of the command end signal CE.

The command end signal CE may include various codes which are recognized by the nonvolatile memory device and inform of the end of transmission of the command "C". As the command end signal CE is input to the nonvolatile memory device, other data signals (e.g., DQ[23:16] and DQ[31:24]) input to the nonvolatile memory device at the first cycle and data signals input to the nonvolatile memory device at a next cycle may be recognized as an address. Here, the first cycle refers to a first interval in which a command and/or an address is latched at a first rising edge of the write enable signal /WE.

In an embodiment, an input/output circuit (e.g., 124 of FIG. 3) of the nonvolatile memory device may sequentially buffer DQ[7:0], DQ[15:8], DQ[23:16], and DQ[31:24] through relevant DQ lines. As such, the controller may analyze the command end signal CE received as DQ[15:8] and may recognize that data received as DQ[7:0] correspond to a command.

Continuing to refer to FIG. 7, the command "C", the command end signal "CE", and the addresses A1 and A2 are transmitted to the nonvolatile memory device at the first cycle, and the addresses A3 to A5 are transmitted to the nonvolatile memory device at a second cycle. Here, the second cycle refers to a second interval in which a command or an address is latched at a second rising edge of the write enable signal /WE.

As described above, when an address is completely transmitted, dummy data (e.g., a dummy address) may be transmitted to the nonvolatile memory device as DQ[31:24] at the second cycle. For example, the dummy address may indicate a physical address in/at a memory area which does not actually exist. When an address is completely transmitted, the address latch enable signal ALE may be disabled to logical low, and the write enable signal /WE may be maintained at logical high as a plateau without cycling to logical low when it otherwise would. Through the above-described operation, a timing of a follow-up operation may be advanced. In an embodiment, as illustrated in FIG. 7, as a loading time tADL from an address to data is advanced in a write operation, a speed of the write operation may be improved.

Figure 8:
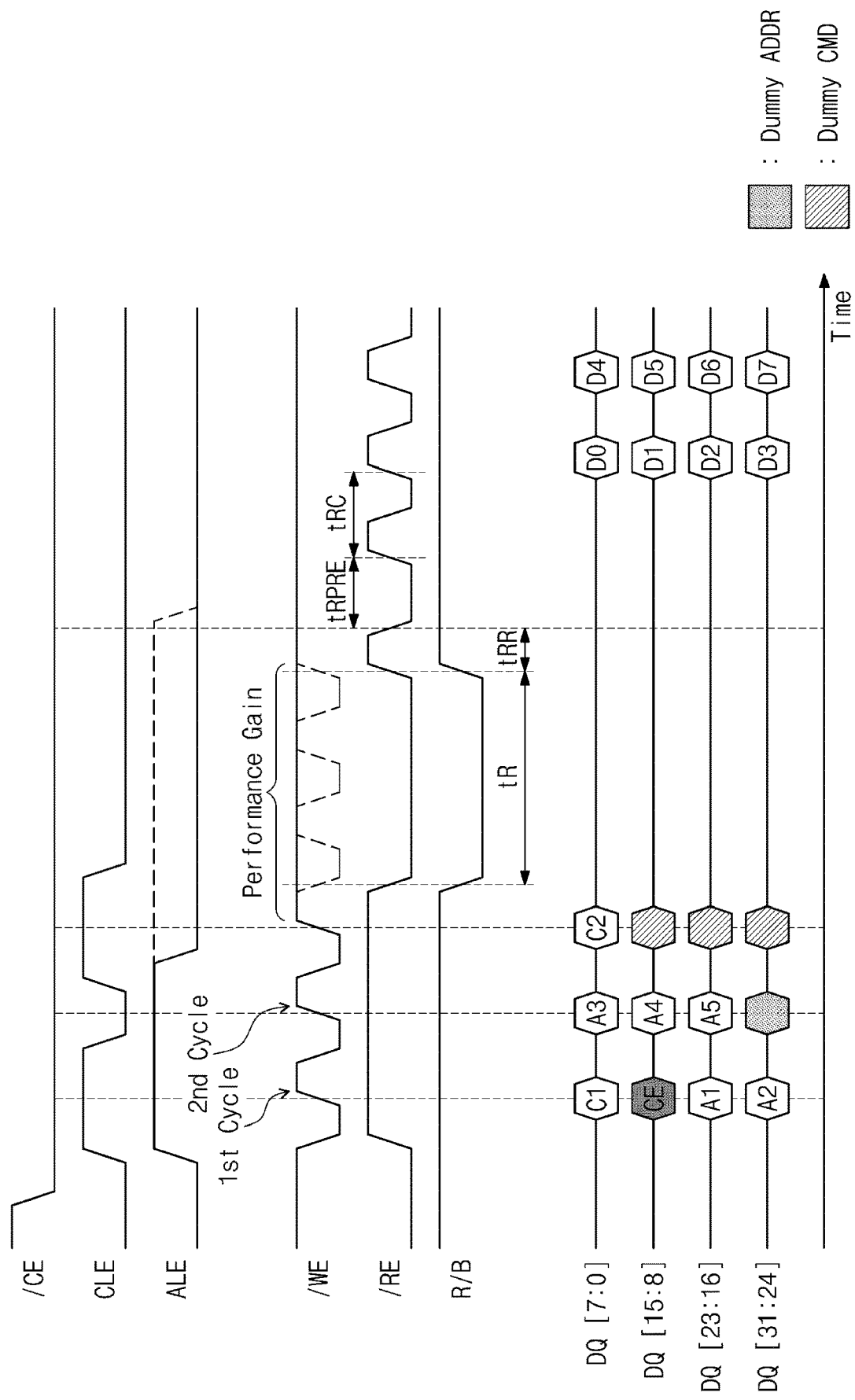
FIG. 8 is another timing diagram showing timing of signals which are input to a nonvolatile memory device according to an exemplary embodiment of the present disclosure.

FIG. 8 is another timing diagram showing timing of signals which are input to a nonvolatile memory device according to an exemplary embodiment of the present disclosure. In an embodiment, it is assumed that a first command C1 and a second command C2 correspond to a set of read commands (e.g., 00h and 30h). For better understanding, a description will be given together with reference to FIG. 2.

An embodiment in which the first command C1, the command end signal CE, and the addresses A1 and A2 are transmitted to a nonvolatile memory device at the first cycle, and the addresses A3 to A5 are transmitted to the nonvolatile memory device at a second cycle is identical to the embodiment of FIG. 7. Thus, additional description will be omitted to avoid redundancy. However, in the embodiment of FIG. 8, the second command C2 associated with a read operation is transmitted as well as the first command C1.

At a cycle following the second cycle, the controller 110 may transmit the second command C2 to a nonvolatile memory device (e.g., NVM1) as DQ[7:0]. However, at the second cycle, the command latch enable signal CLE may be disabled such that addresses of the second cycle are not latched by the command latch enable signal CLE. However, to latch the second command C2 at a third cycle, the controller 110 may again enable the command latch enable signal CLE. For example, an interval in which the command latch enable signal CLE is again enabled may include an interval in which the second command C2 is transmitted.

At the same time in the third cycle, the controller 110 may also transmit dummy commands to the nonvolatile memory device through the remaining DQ lines (e.g., DQ[15:8], DQ[23:16], and DQ[31:24]) other than the DQ lines through which the second command C2 is transmitted.

After the second command C2 is completely transmitted at the cycle following the second cycle, the controller 110 may disable the command latch enable signal CLE and may disable the write enable signal /WE to logical high. In FIG. 8, the latching at the third cycle is at a rising edge of the write enable signal /WE, so the write enable signal /WE may be disabled by simply leaving the write enable signal /WE at the high level. As such, as illustrated in FIG. 8, an interval between a third rising edge and a sixth rising edge of the write enable signal /WE may be additionally secured. Accordingly, timings of times (e.g., tR (data transfer from flash array to register), tRR (ready to /RE low), tPRE (read preamble), and tRC (read cycle time)) necessary to output read data D0 to D8 in a read operation may be advanced. As a result, a read speed of a nonvolatile memory device is improved. Advancing timing of times may be considered to mean moving times earlier, performing operations faster or earlier than otherwise, and/or skipping one or more first operations that would otherwise be performed in order to perform second operations at an advanced timing.

Moreover, the embodiment of FIG. 8 corresponds to an embodiment in which multiple data signals including two commands and an address are transmitted within two cycles by using 32 DQ lines. However, in the case where more DQ lines are used, multiple commands and an address may be completely transmitted within two cycles. For example, in the case where a storage device includes 64 DQ lines, all of the first command C1, the command end signal CE, and the addresses A1 to A5 may be transmitted to a nonvolatile memory device at a first cycle. When the second command C2 is transmitted at the second cycle, both commands and addresses may be transmitted within two cycles.

Figure 9:
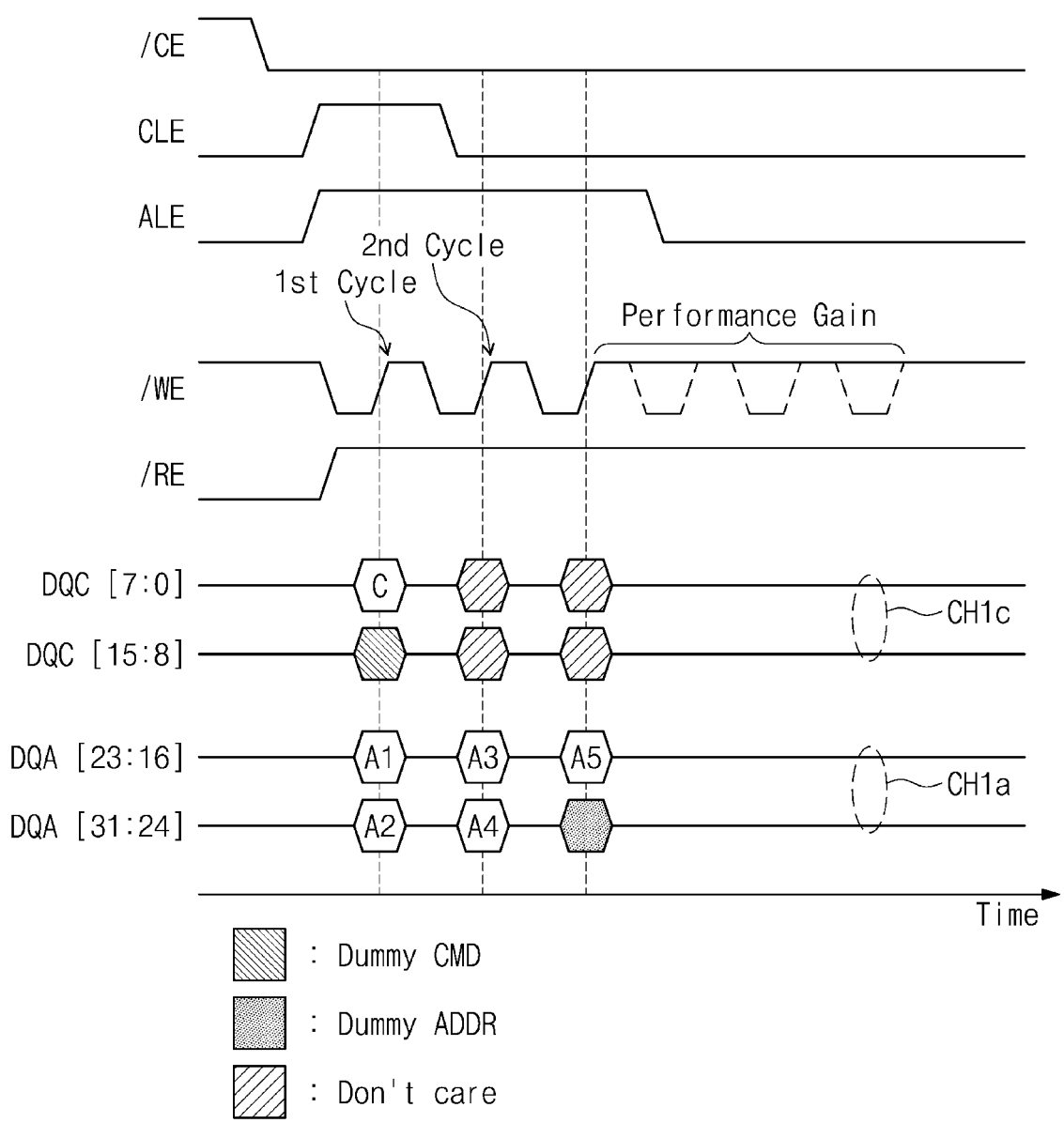
FIG. 9 is another timing diagram showing timing of signals which are input to a nonvolatile memory device according to an exemplary embodiment of the present disclosure.

FIG. 9 is another timing diagram showing timing of signals which are input to a nonvolatile memory device according to an exemplary embodiment of the present disclosure. For better understanding, a description will be given together with reference to FIG. 2.

In an embodiment, to identify a command and an address to be transmitted to a nonvolatile memory device (e.g., NVM1), a portion of the first channel CH1 may be assigned to a channel through which a command is transmitted, and the remaining portion of the first channel CH1 may be assigned to a channel through which an address is transmitted. In an embodiment, DQ lines through which a command is transmitted may be assigned to a first command channel CH1c, and DQ lines through which an address is transmitted may be assigned to a first address channel CH1a. DQC[7:0] and DQC[15:8] illustrated in FIG. 9 indicate data signals associated with a command, and DQA[23:16] and DQA[31:24] indicate data signals associated with an address.

In an embodiment, the controller 110 may transmit the command "C" to a nonvolatile memory device (e.g., NVM1) through the first command channel CH1c at a first cycle as DQC[7:0]. At the same time, the controller 110 may also transmit a dummy command to the nonvolatile memory device through the first command channel CH1c at the first cycle as DQC[15:8]. The controller 110 may also transmit the addresses A1 and A2 to the nonvolatile memory device through the first address channel CH1a at the first cycle as DQA [23:16] and DQA [31:24].

In an embodiment, the controller 110 may transmit the addresses A3 to A5 to the nonvolatile memory device through the first address channel CH1a at cycles following the first cycle.

Moreover, in the embodiment illustrated in FIG. 9, 16 DQ lines corresponding to DQC[7:0] and DQC[15:8] are assigned to a command channel, and 16 DQ lines corresponding to DQA [23:16] and DQA [31:24] are assigned to an address channel. However, the present disclosure is not limited thereto.

The case where a command channel and an address channel are separated as described above may require one additional rising edge of the write enable signal /WE compared with the embodiment of FIG. 7. Nevertheless, a timing of a follow-up operation may be advanced in the embodiment of FIG. 9. Therefore, the performance of the storage device 100 may be improved.

Figure 10A:
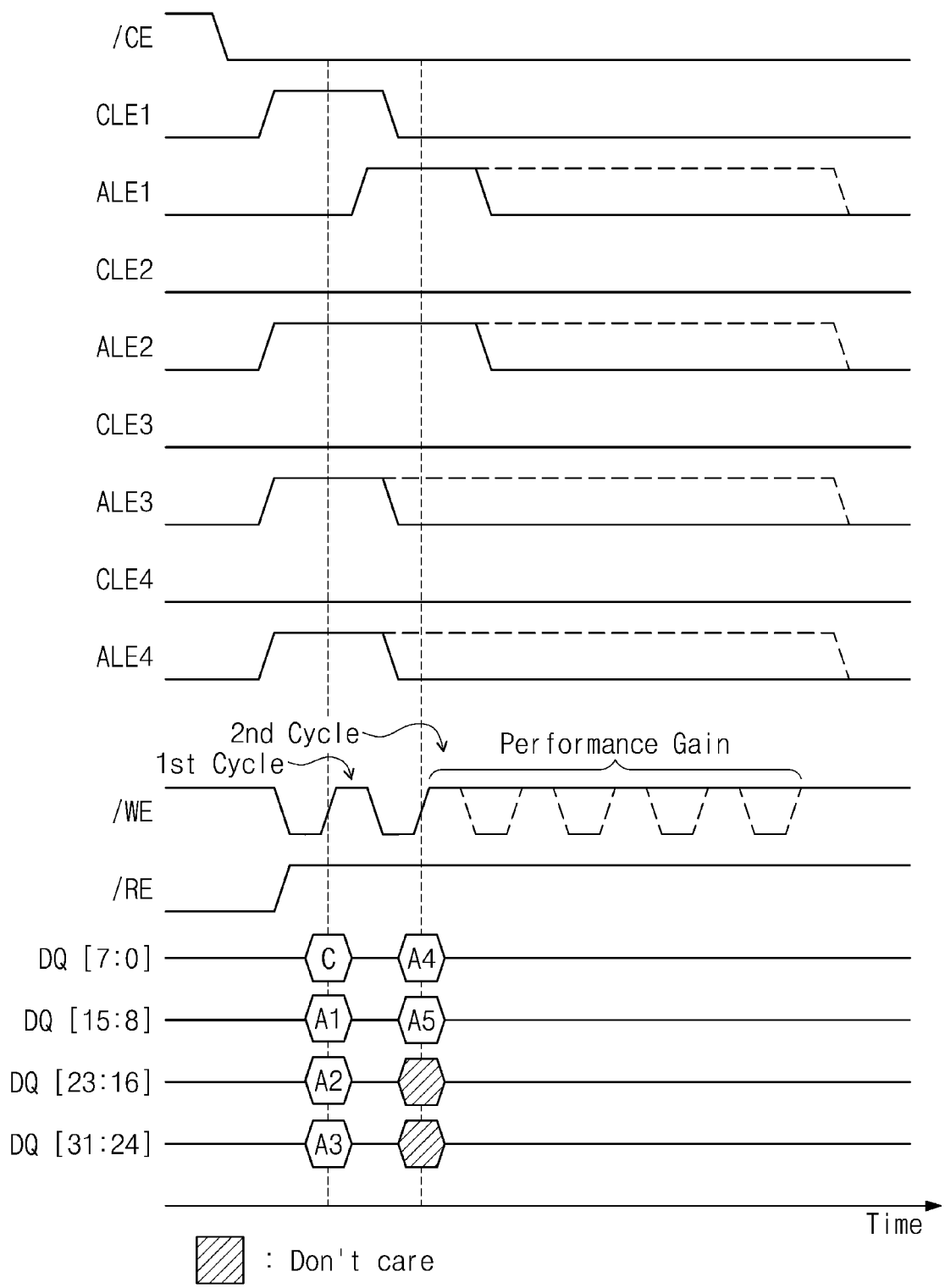
FIGS. 10A and 10B are timing diagrams showing timing of signals which are input to a nonvolatile memory device according to an exemplary embodiment of the present disclosure.
Figure 10B:
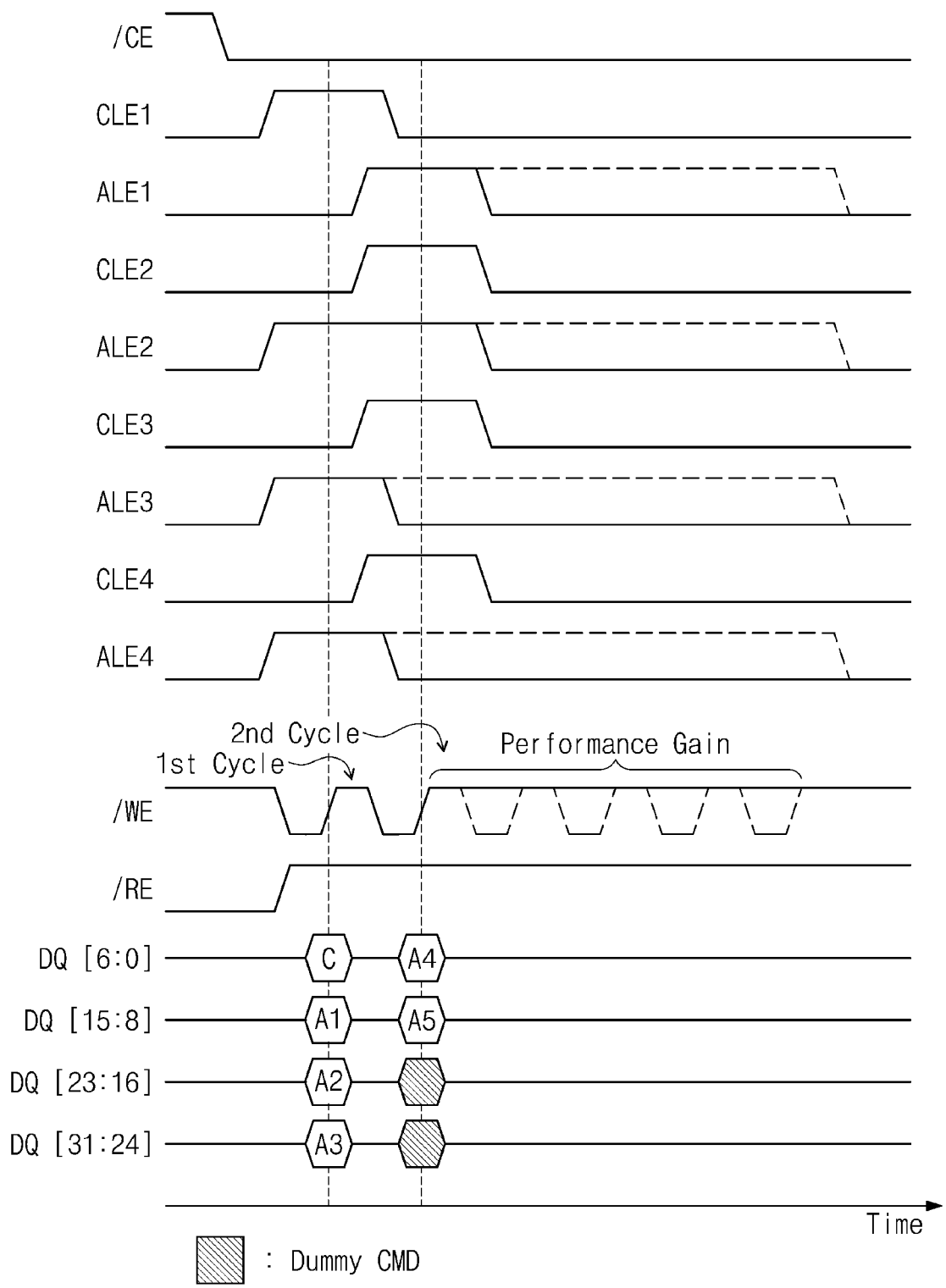

FIGS. 10A and 10B are timing diagrams showing timing of signals which are input to a nonvolatile memory device according to an exemplary embodiment of the present disclosure. For better understanding, a description will be given together with reference to FIG. 2.

Referring to FIG. 10A, the controller 110 may generate control signals for identifying data signals that are different from each other. In an embodiment, the controller 110 may generate a first command latch enable signal CLE1 and a first address latch enable signal ALE1 for identifying DQ[7:0] and the command "C". That is, the first command latch enable signal CLE1 and the first address latch enable signal ALE are used to identify only DQ[7:0] and are not used to identify any other data signals. Therefore, it doesn't matter if the addresses A1 to A3 are simultaneously latched by a nonvolatile memory device (e.g., NVM1) at a first cycle. As in the above description, the controller 110 generates a second command latch enable signal CLE2 and a second address latch enable signal ALE2 for identifying DQ[15:8].

The controller 110 generates a third command latch enable signal CLE3 and a third address latch enable signal ALE3 for identifying DQ[23:16]. The controller 110 generates a fourth command latch enable signal CLE4 and a fourth address latch enable signal ALE4 for identifying DQ[31:24]. In the embodiment of FIG. 10A, the second command latch enable signal CLE2, the third command latch enable signal CLE3 and the fourth command latch enable signal CLE4 are all set to low values throughout as only the first command latch CLE 1 is used to identify the command "C" or any command in this embodiment. Similarly, in the embodiment of FIG. 10A the various address latch enable signals ALE1 to ALE 4 are only set to high values when the corresponding addresses A1 to A5 are to be latched in the first cycle or the second cycle. In an embodiment, the controller 110 may further include three pairs of pins for the purpose of transmitting three pairs of additional control signals (CLE2, CLE3, CLE4 and ALE2, ALE3 and ALE4) to the nonvolatile memory device, in addition to a pair of existing control signals (e.g., CLE1 and ALE1). In FIG. 10A, a performance gain still results after the second cycle as indicated.

An embodiment of FIG. 10B is mostly similar to the embodiment of FIG. 10A. However, unlike the embodiment of FIG. 10A in which values of DQ[23:16] and DQ[31:24] at the second cycle are don't care values, in the case of the embodiment of FIG. 10B, a dummy command may be transmitted as DQ[23:16] and DQ[31:24] at the second cycle. However, in this case, to latch a dummy command, a command latch enable signal may be enabled. That is, the third command latch enable signal CLE3 and the fourth command latch enable signal CLE4 may be enabled at the second cycle as shown in FIG. 10B, to latch the dummy command. In FIG. 10B, a performance gain still results after the second cycle as shown.

Figure 11:
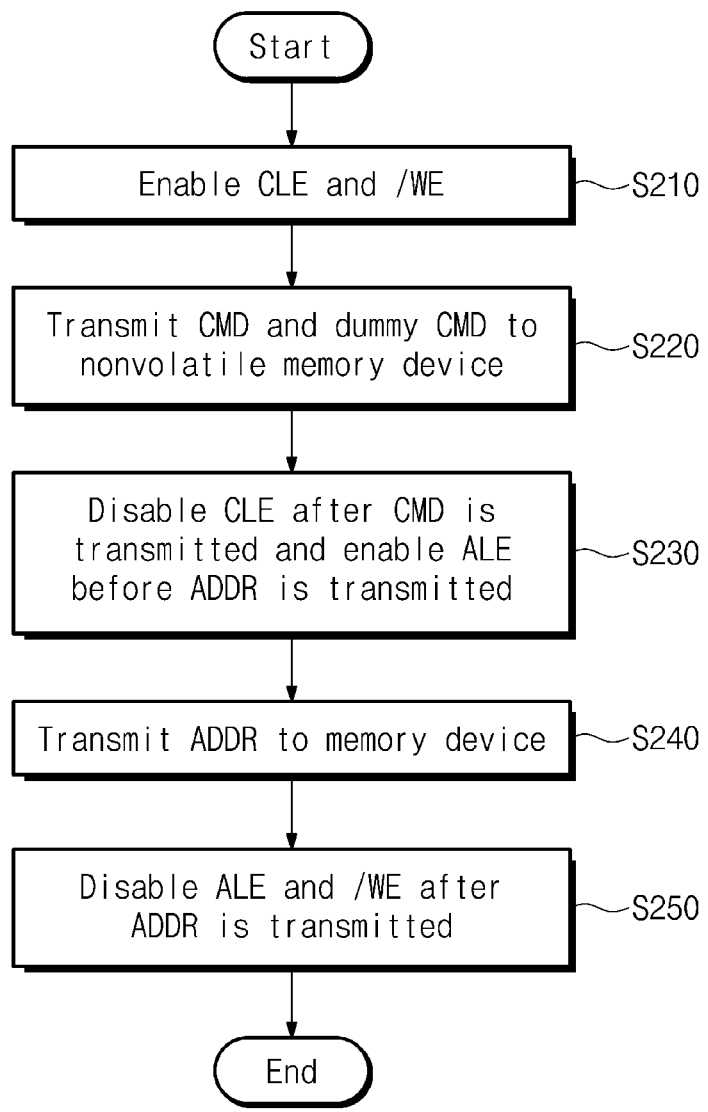
FIG. 11 illustrates an operating method of a controller which controls a nonvolatile memory device according to an embodiment of the present disclosure.
Figure 12:
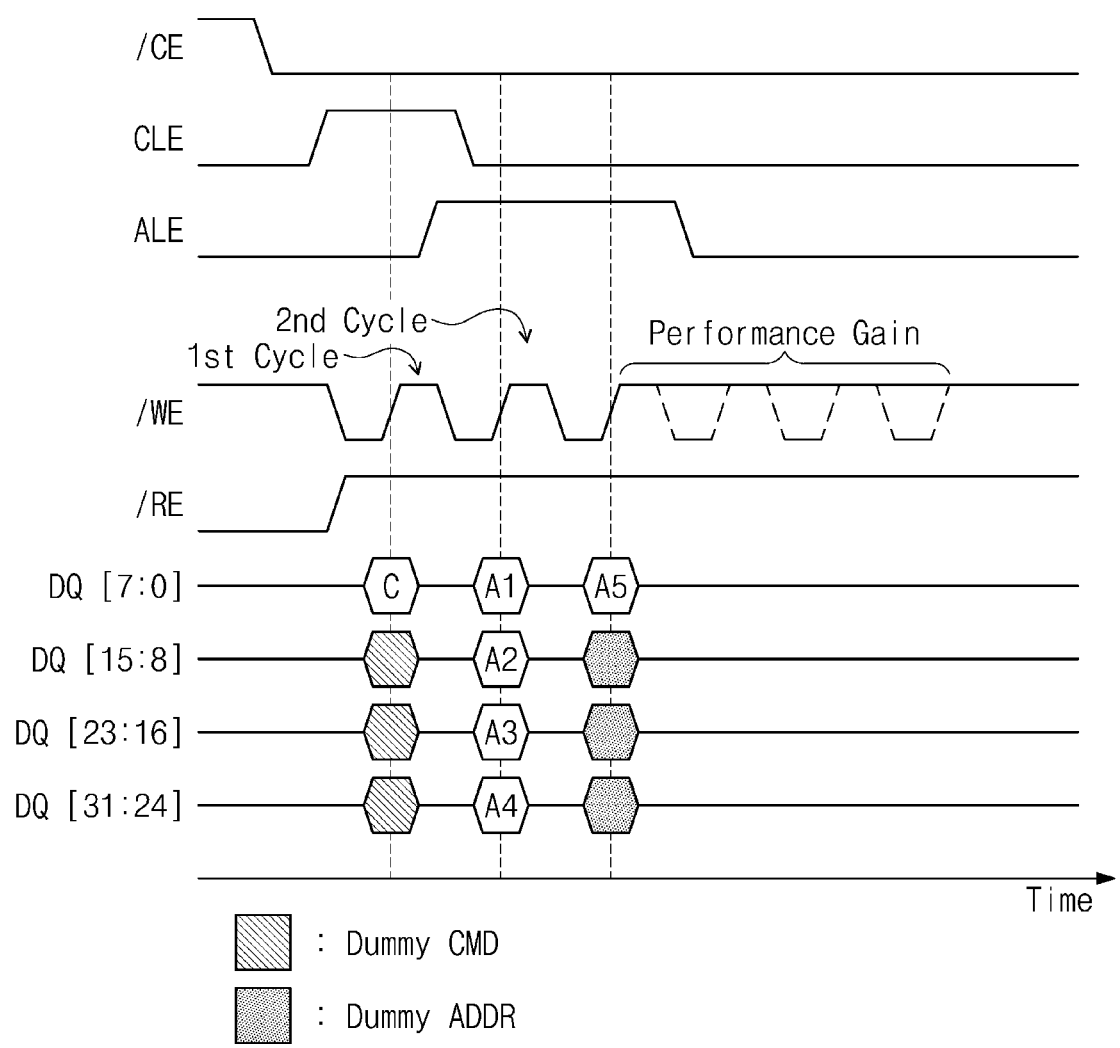
FIG. 12 is another timing diagram showing timing of signals which are input to a nonvolatile memory device according to an embodiment of the present disclosure.

FIG. 11 illustrates an operating method of a controller which controls a nonvolatile memory device according to an embodiment of the present disclosure. FIG. 12 is another timing diagram showing timing of signals which are input to a nonvolatile memory device according to an embodiment of the present disclosure. A way to identify a command and an address by transmitting the command and the address at different cycles through DQ lines of a wide I/O will be described in this embodiment. For better understanding, a description will be given together with reference to FIGS. 2, 11, and 12.

In operation S210, the controller 110 may enable the command latch enable signal CLE and the write enable signal /WE. As the write enable signal /WE is enabled, the write enable signal /WE may include pulses including rising edges for latching the command "C" and the addresses A1 to A5. The controller 110 may transmit enable signals to a nonvolatile memory device (e.g., NVM1).

In an embodiment, an interval in which the command latch enable signal CLE is enabled may include an interval in which the command "C" is input. However, to secure a margin, the interval in which the command latch enable signal CLE is enabled may be wider than the interval in which the command "C" is input but may be limited to a range for preventing an address from being latched by the command latch enable signal CLE at a next cycle.

In operation S220, the controller 110 may transmit the command "C" and a dummy command to the nonvolatile memory device at a first cycle. The command "C" may be transmitted to the nonvolatile memory device as DQ[7:0], and the dummy command may be transmitted to the nonvolatile memory device as DQ[15:8], DQ[23:16], and DQ[31:24]. The nonvolatile memory device may recognize a command by latching the command "C" at a first rising edge of the received write enable signal /WE.

In operation S230, after the command "C" is completely transmitted, the controller 110 may disable the command latch enable signal CLE. Before an address is transmitted to the nonvolatile memory device, the controller 110 may enable the address latch enable signal ALE.

In operation S240, the controller 110 may transmit the addresses A1 to A5 to the nonvolatile memory device. The nonvolatile memory device may recognize an address by latching the addresses A1 to A5 at cycles following a first cycle of the received write enable signal /WE.

In operation S250, after the addresses A1 to A5 are completely transmitted, the controller 110 may disable the address latch enable signal ALE and the write enable signal /WE. For example, the address latch enable signal ALE may transition to logical low, and the write enable signal /WE may be maintained at logical high.

In this embodiment, since a command and an address are transmitted to a nonvolatile memory device at different cycles, unlike the above embodiments, a separate scheme for identifying a command and an address may not be required. Even though a rising edge of the write enable signal /WE is required one more time compared with the embodiment of FIG. 7, a timing of a follow-up operation may be advanced, and thus, the performance of the storage device 100 may be improved.

Figure 13:
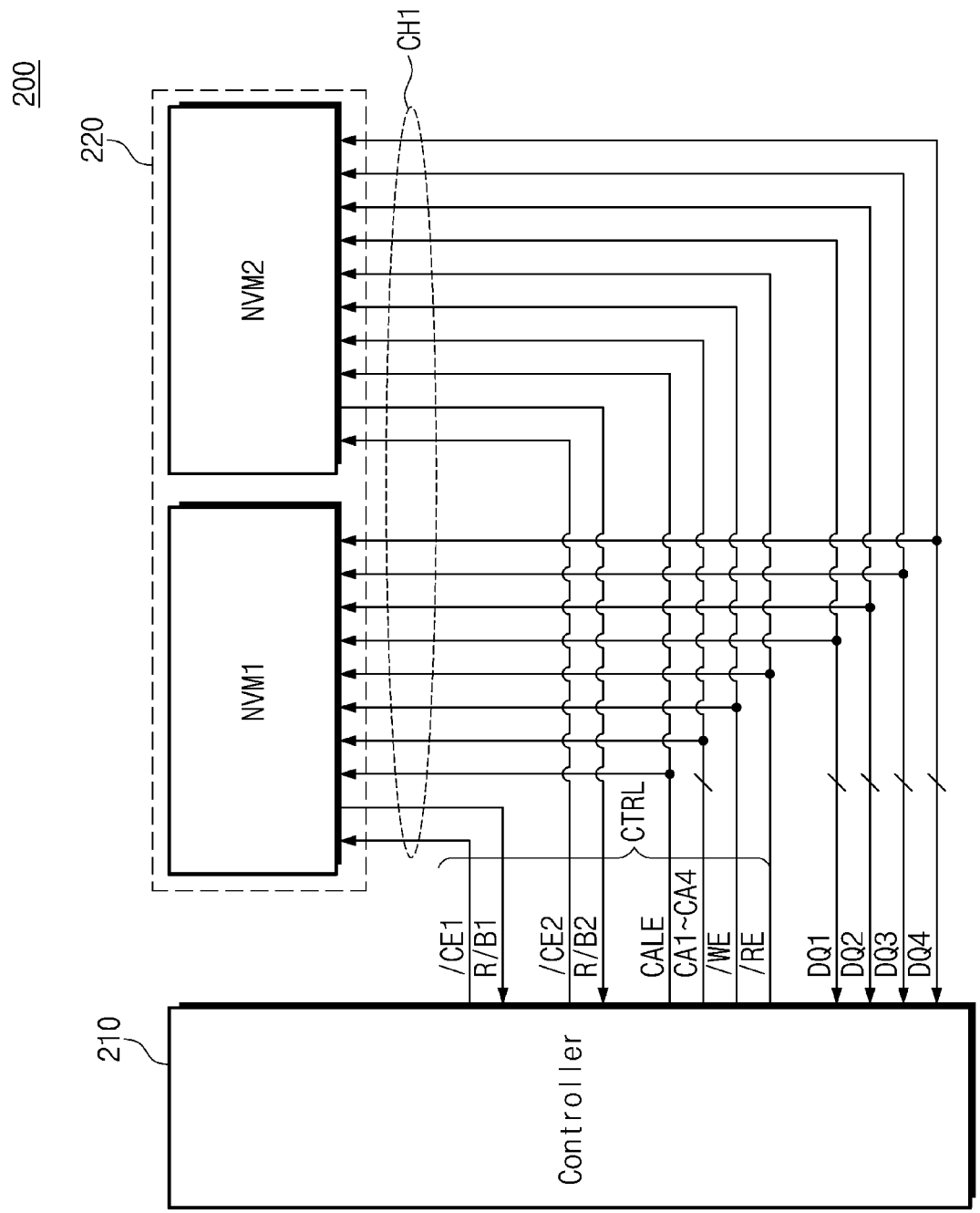
FIG. 13 illustrates an exemplary configuration of a storage device of FIG. 1 in detail.

FIG. 13 illustrates another exemplary configuration of a storage device of FIG. 1 in detail. A storage device 200 may include a controller 210 and a nonvolatile memory device 220. The storage device 200 includes DQ lines of a wide I/O and is mostly similar to the storage device 100 of FIG. 2. Below, a difference between the storage device 100 and the storage device 200 will be mainly described.

The controller 210 may communicate with the nonvolatile memory devices NVM1 and NVM2 through the first channel CH1. The controller 210 may exchange the data signals DQ1 to DQ4 with the nonvolatile memory devices NVM1 and NVM2 through the first channel CH1 by using the control signals CTRL. The data signals DQ1 to DQ4 may correspond to DQ[7:0], DQ[15:8], DQ[23:16], and DQ[31:24], respectively. Each data signal may include the command CMD, the address ADDR, and/or the data DATA.

In an embodiment, the control signals CTRL include, for example, the chip enable signals /CE1 and /CE2, the ready and busy signals R/B1 and R/B2, a command and address latch enable signal CALE, a command address indication signal CA, a write enable signal /WE, a read enable signal /RE.

In an embodiment, the command and address latch enable signal CALE and command address indication signals CA1 to CA4 may be used to identify a command and an address. The command and address latch enable signal CALE may be enabled in an interval (or cycle) where a command or an address is transmitted. The command address indication signal CA may indicate a command or an address depending on a logical state. For example, the command address indication signal CA which is at logical high may indicate a command directed to the nonvolatile memory device, and the command address indication signal CA which is at logical low may indicate an address directed to the nonvolatile memory device. However, the present disclosure is not limited thereto. For example, the command address indication signal CA which is at logical low may indicate a command directed to the nonvolatile memory device, and the command address indication signal CA which is at logical high may indicate an address directed to the nonvolatile memory device.

Figure 14:
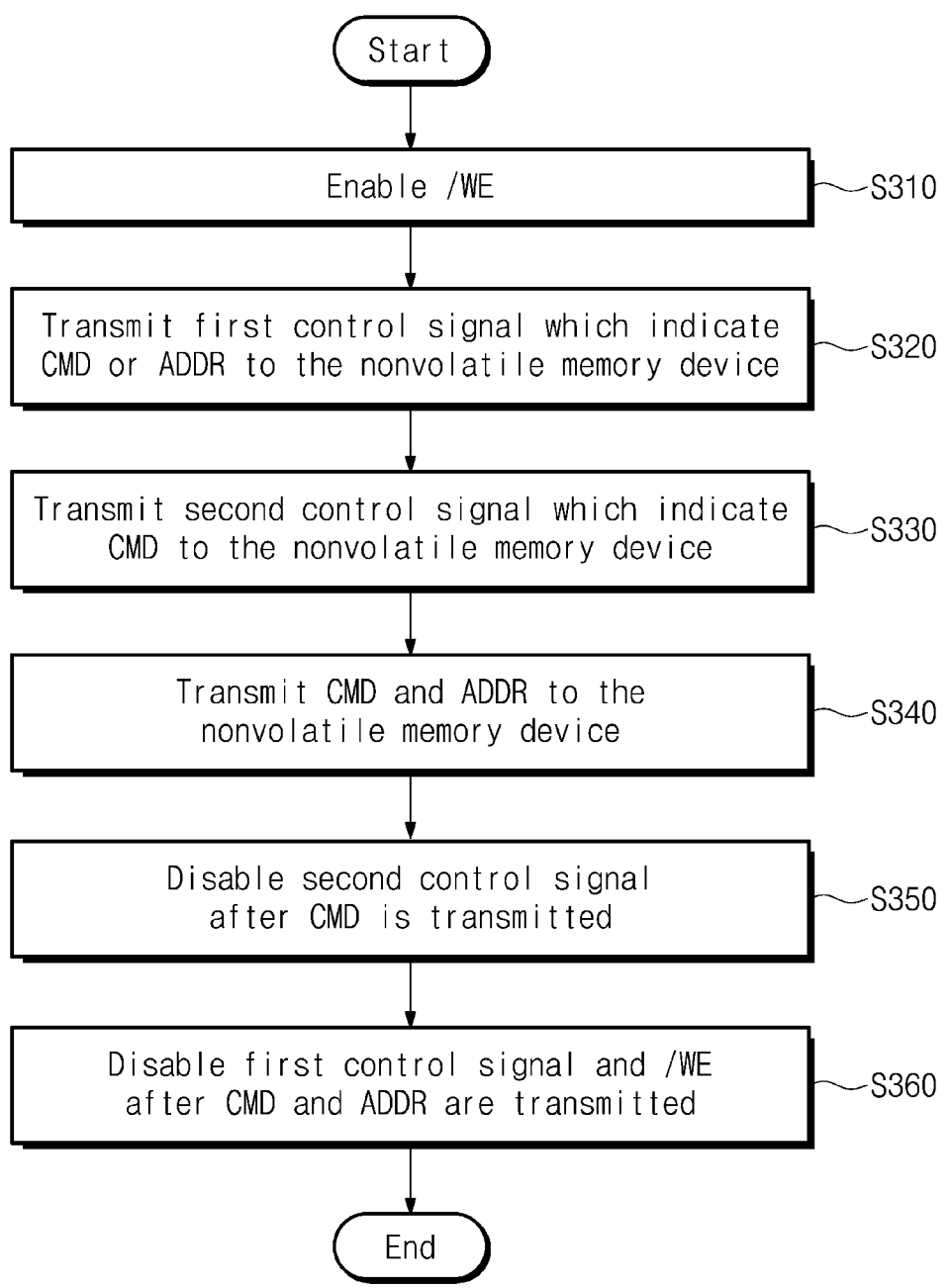
FIG. 14 illustrates an operating method of a controller which controls a nonvolatile memory device according to an exemplary embodiment of the present disclosure.
Figure 15:
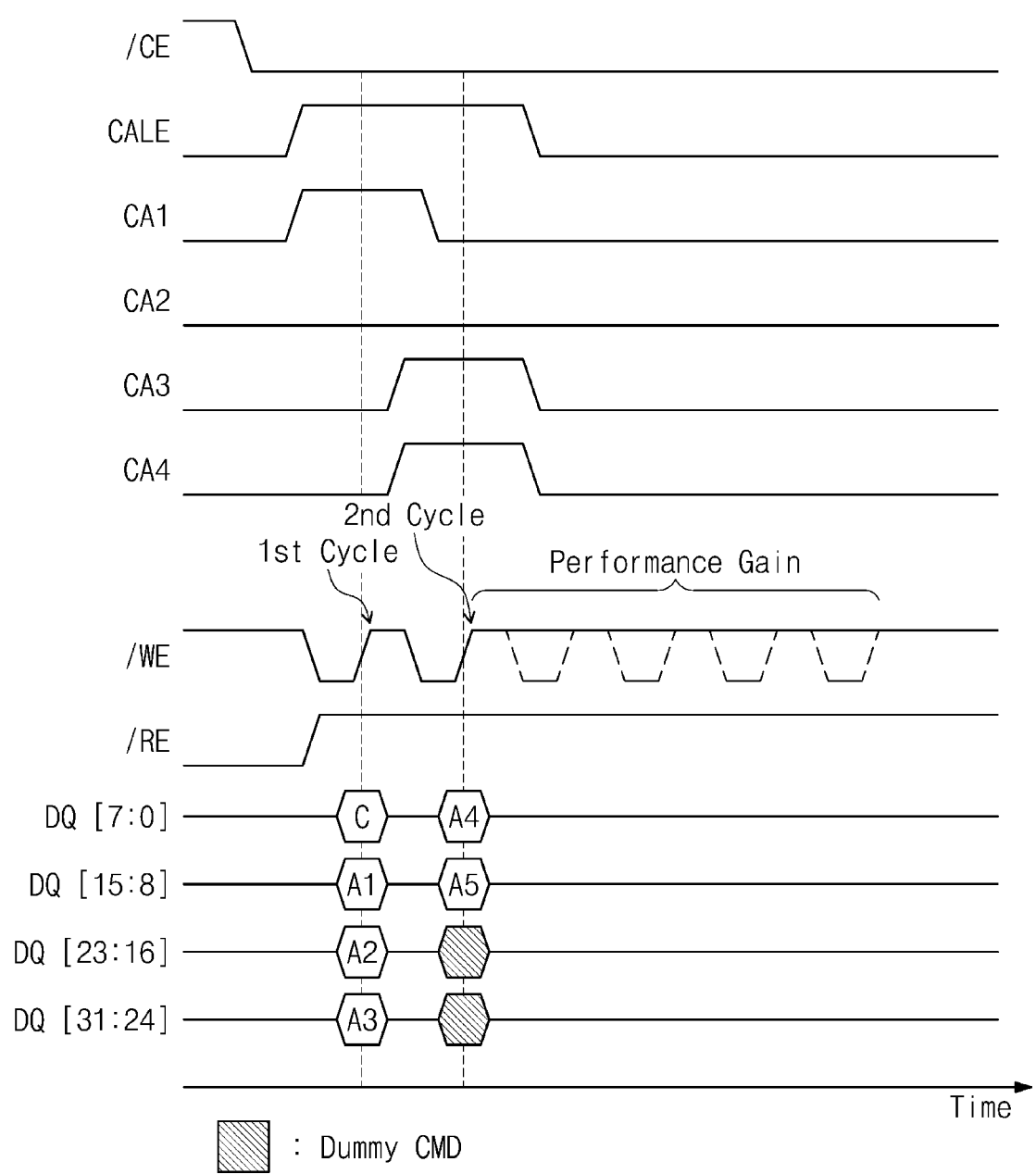
FIG. 15 is another timing diagram showing timing of signals which are input to a nonvolatile memory device according to an exemplary embodiment of the present disclosure.

FIG. 14 illustrates an operating method of a controller which controls a nonvolatile memory device according to an exemplary embodiment of the present disclosure. FIG. 15 is another timing diagram showing timing of signals which are input to a nonvolatile memory device according to an exemplary embodiment of the present disclosure. For better understanding, a description will be given together with reference to FIGS. 13, 14, and 15.

In operation S310, the controller 210 may enable the write enable signal /WE. That the write enable signal /WE is enabled may means that the write enable signal /WE includes a pulse including a rising edge (i.e., a pulse including an edge rising from the low level to the high level) for latching a command or an address.

In operation S320, the controller 210 may transmit a first control signal to the nonvolatile memory device NVM1. The first control signal may indicate that a command and an address are transmitted. In an embodiment, a command or an address may be transmitted to the nonvolatile memory device in first interval in which the first control signal is a logically high state. In contrast, a command and an address may not be transmitted in a second interval in which the first control signal is a logically low state. In an embodiment, the first control signal may be the command and address latch enable signal CALE.

In operation S330, the controller 210 may transmit a second control signal to the nonvolatile memory device. A command is transmitted based on logical states of the first control signal and the second control signal. In an embodiment, a command is transmitted in a first interval in which the first control signal is at logical high and the second control signal is at logical high. In contrast, an address is transmitted in a second interval in which the first control signal is at logical high and the second control signal is at logical low. In an embodiment, the second control signal may be any one of the command address indication signals CA1 to CA4.

In operation S340, the controller 210 may transmit the command "C" and the addresses A1 to A5 to the nonvolatile memory device. The command "C" and the addresses A1 to A3 are transmitted to the nonvolatile memory device at a first cycle, and the addresses A4 and A5 are transmitted to the nonvolatile memory device at a second cycle.

The command "C" and addresses A1 to A3 transmitted at the first cycle may be latched by the nonvolatile memory device at a first rising edge of the write enable signal /WE. The addresses A4 and A5 transmitted at the second cycle may be latched by the nonvolatile memory device at a second rising edge of the write enable signal /WE. The controller 210 may transmit dummy data to the nonvolatile memory device at the second cycle as DQ[23:16] and DQ[31:24].

In operation S350, after the command is transmitted, the controller 210 may disable the second control signal. Since the enable of the second control signal corresponds to a command and the disable of the second control signal corresponds to an address, even though the second control signal is disabled, information about an address to be transmitted may be sufficiently transmitted.

In operation S360, after the command and the address are transmitted, the controller 210 may disable the first control signal and the write enable signal /WE. Since the first control signal indicates a command or an address directed to the nonvolatile memory device, the disable of the first control signal indicates that the command and the address are completely transmitted.

An embodiment is described as the second control signal indicates a command directed to the nonvolatile memory device, but it is also possible to use the second control signal to indicate an address. In an embodiment, an address is transmitted in a first interval in which the first control signal is at logical high and the second control signal is at logical high. In contrast, a command is transmitted in a second interval in which the first control signal is at logical high and the second control signal is at logical low.

Moreover, instead of the case where the command latch enable signal CLE and the address latch enable signal ALE are used as described in the embodiment of FIG. 2, in this embodiment, the command and address latch enable signal CALE and the newly-defined command address indication signals CA1 to CA4 are used. Therefore, three pins for transmitting control signals to the nonvolatile memory device may be used in this embodiment.

According to this embodiment, pulses having rising edges of the write enable signal /WE may be prevented from being transmitted unnecessarily after the data signals DQ are completely transmitted. As a result, since a timing of a follow-up operation (e.g., transmission of data) is advanced, the performance of the storage device 200 may be improved.

Figure 16:
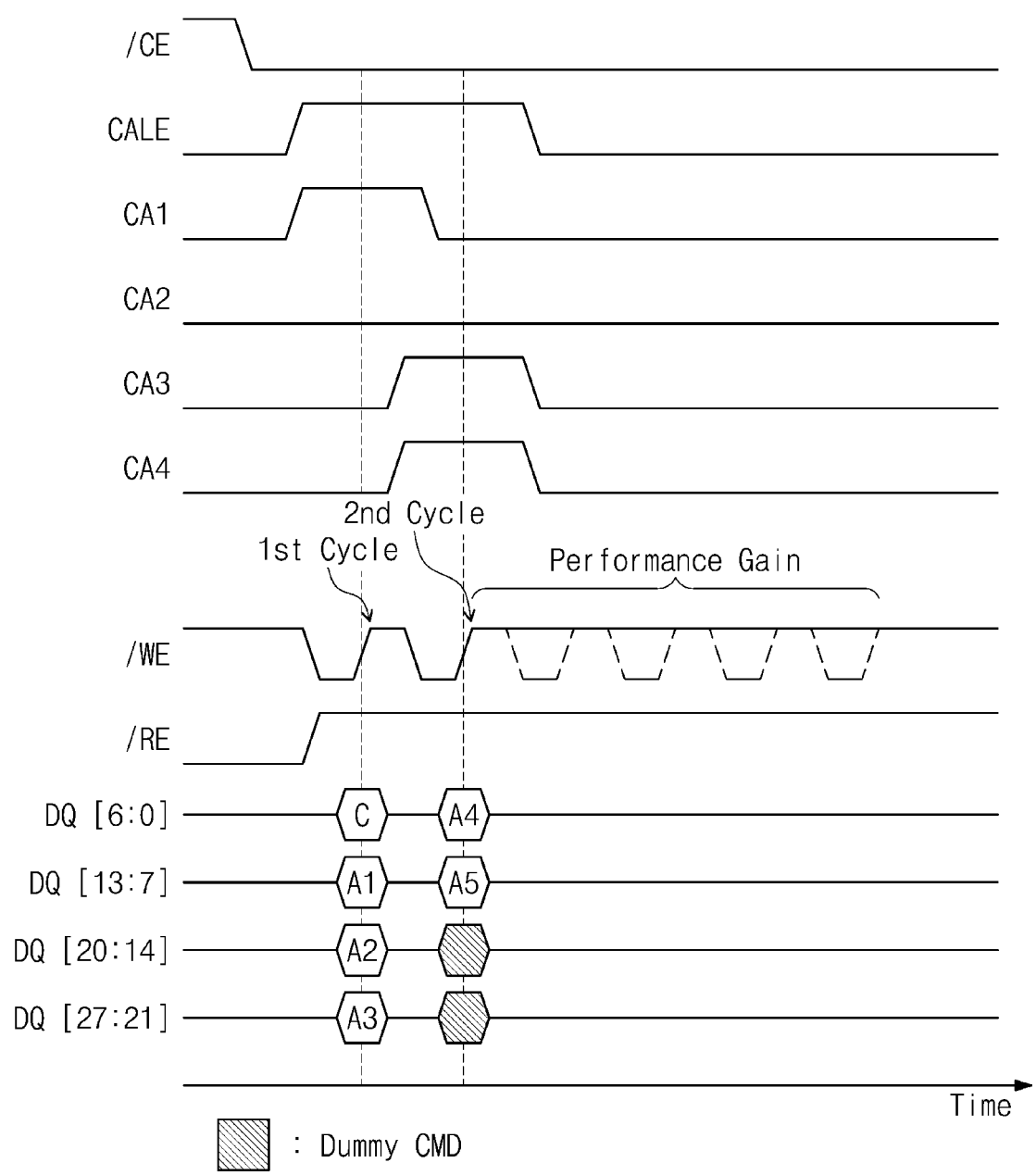
FIG. 16 is another timing diagram showing timing of signals which are input to a nonvolatile memory device according to an exemplary embodiment of the present disclosure.

FIG. 16 is another timing diagram showing timing of signals which are input to a nonvolatile memory device according to an exemplary embodiment of the present disclosure. The embodiment of FIG. 16 is mostly similar to the embodiment of FIG. 15. Thus, additional description will be omitted to avoid redundancy. For better understanding, a description will be given together with reference to FIG. 13.

In an embodiment, each of the data signals DQ1 to DQ4 may be composed of 7 bits. That is, the data signals DQ1 to DQ4 may correspond to each of DQ[6:0], DQ[13:7], DQ[20:14], and DQ[27:21]. Therefore, each data signal may be transmitted to a nonvolatile memory device through 7 DQ lines.

In the embodiment of FIG. 15, three pins for transmitting control signals are used compared with the embodiment of FIG. 2. However, in the embodiment of FIG. 16, since each data signal is composed of 7 bits, three DQ lines may be secured compared with the embodiment of FIG. 15. Therefore, additional pins for transmitting control signals are not required.

Figure 17:
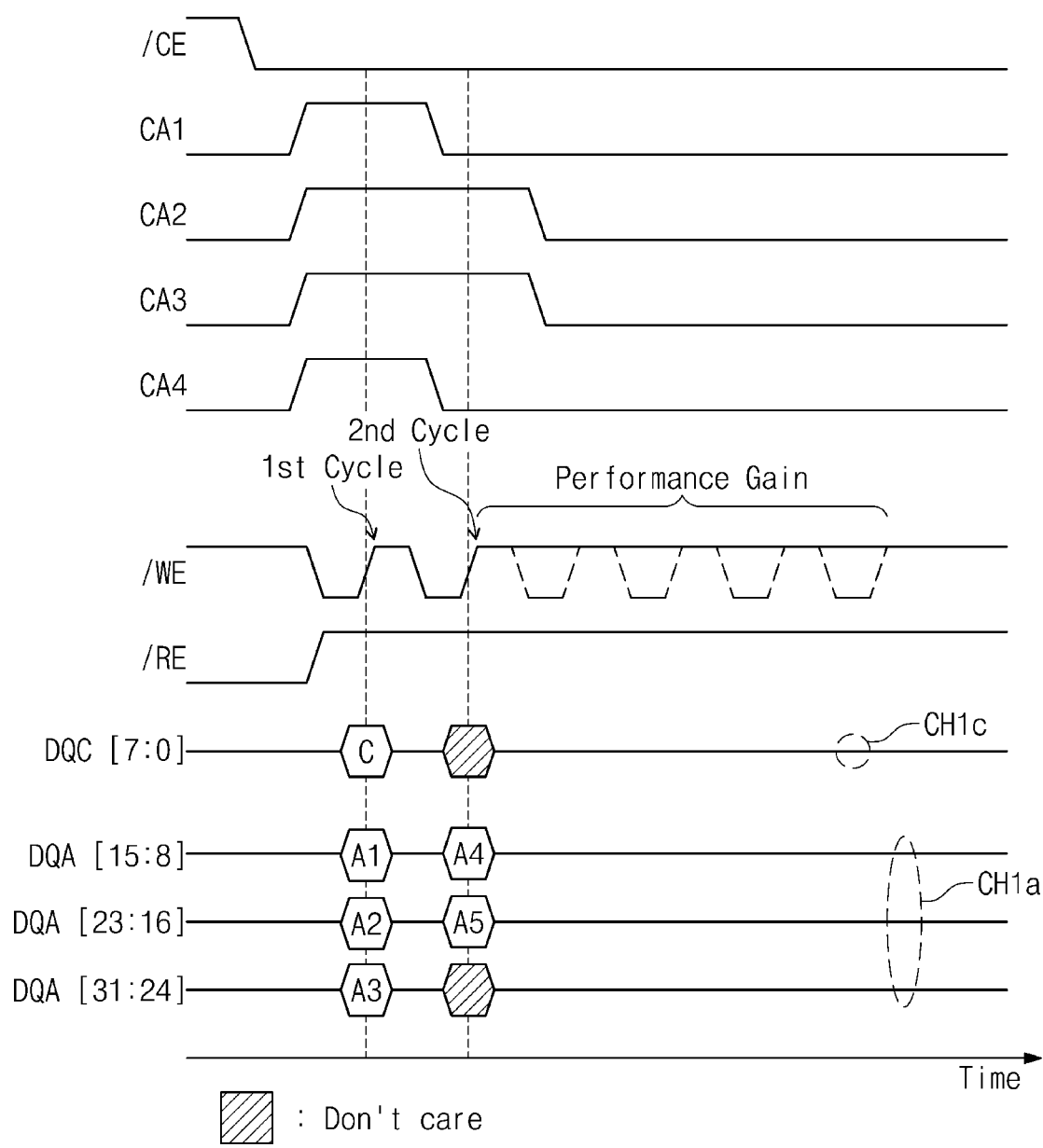
FIG. 17 is another timing diagram showing timing of signals which are input to a nonvolatile memory device according to an exemplary embodiment of the present disclosure.

FIG. 17 is another timing diagram showing timing of signals which are input to a nonvolatile memory device according to an exemplary embodiment of the present disclosure. The embodiment of FIG. 17 is mostly similar to the embodiments of FIGS. 15 and 16. Thus, additional description will be omitted to avoid redundancy. For better understanding, a description will be given together with reference to FIG. 13.

In an embodiment, to identify a command and an address to be transmitted to a nonvolatile memory device, a portion of the first channel CH1 may be assigned to a channel through which a command is transmitted, and the remaining portion of the first channel CH1 may be assigned to a channel through which an address is transmitted. In an embodiment, DQ lines through which a command is transmitted may be assigned to a first command channel CH1c, and DQ lines through which an address is transmitted may be assigned to a first address channel CH1a. In FIG. 17, DQC[7:0] as illustrated indicates data signals associated with a command, and DQA[15:8], DQA[23:16], and DQA [31:24] as illustrated indicate data signals associated with an address.

In an embodiment, the controller 210 may transmit the command "C" to a nonvolatile memory device (e.g., NVM1) through the first command channel CH1c at a first cycle as DQC[7:0]. The controller 210 may transmit the addresses A1, A2, and A3 to the nonvolatile memory device through the first address channel CH1a at the first cycle as DQA [15:8], DQA [23:16], and DQA [31:24]. However, since the transmission of the command "C" ends at the first cycle, the addresses A4 and A5 may be transmitted to the nonvolatile memory device through the first address channel CH1a at a cycle following the first cycle.

In an embodiment, the controller 210 may transmit the addresses A4 and A5 to the nonvolatile memory device through the first address channel CH1a at cycles following the first cycle as DQA [15:8] and DQA [23:16].

In the embodiment illustrated in FIG. 17, 8 DQ lines corresponding to DQC[7:0] are assigned to a command channel, and 24 DQ lines corresponding to DQA [15:8], DQA [23:16], and DQA [31:24] are assigned to an address channel. However, the present disclosure is not limited thereto.

According to the above embodiments, an issue which occurs when existing relevant specifications are applied to a storage device having DQ lines of the wide I/O may be solved in various methods. Since the address latch enable signal ALE and/or the write enable signal /WE are prevented from being enabled unnecessarily, a timing when a follow-up operation (e.g., exchange of data) is performed may be advanced. Therefore, the performance of the storage device 200 may be improved, which may include faster operating speeds, more efficient operations that reduce the amount of cycles, and account for secondary effects such as delineation between commands and addresses.

Figure 18:
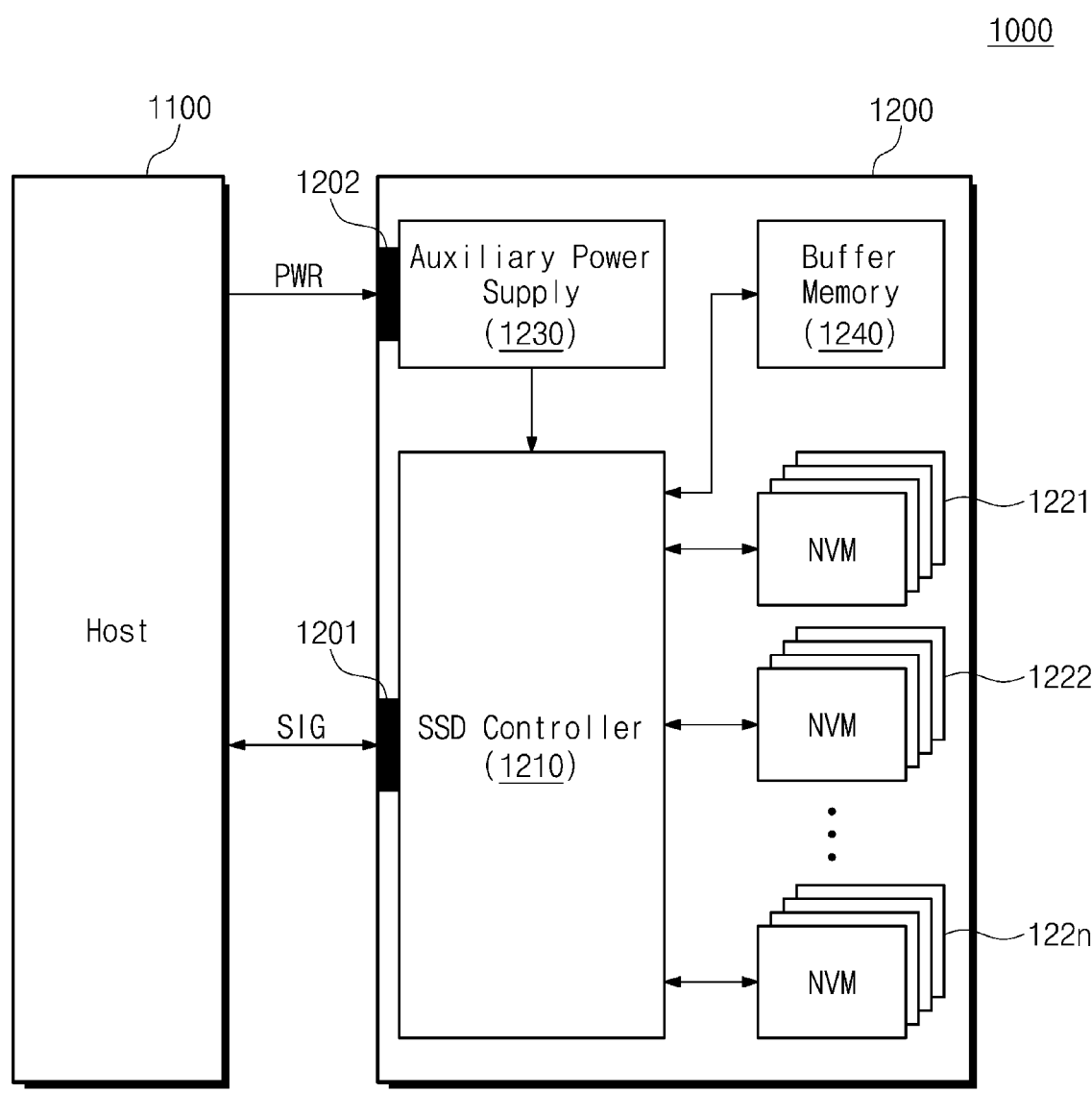
FIG. 18 illustrates a solid state drive (SSD) system to which secure erase and secure write of the present disclosure are applied.

FIG. 18 illustrates an SSD system 1000 (solid state drive system) to which a wide I/O of the present disclosure are applied. Referring to FIG. 18, the SSD system 1000 may include a host 1100 and an SSD 1200.

The SSD 1200 may exchange signals SIG with the host 1100 through a signal connector 1201 and may be supplied with a power PWR through a power connector 1202. The SSD 1200 may include an SSD controller 1210, multiple flash memories 1221 to 122n, an auxiliary power supply 1230, and a buffer memory 1240.

The SSD controller 1210 may control the flash memories 1221 to 122n in response to a signal SIG received from the host 1100. For example, the SSD controller 1210 controls control signals (e.g., the address latch enable signal ALE and the write enable signal /WE) to be input to the flash memories 1221 to 122n, based on the embodiments described with reference to FIGS. 1 to 17. The SSD controller 1210 may make the performance of the SSD 1200 better by preventing the address latch enable signal ALE and the write enable signal /WE from being enabled unnecessarily.

The flash memories 1221 to 122n may operate under control of the SSD controller 1210. The auxiliary power supply 1230 may be connected with the host 1100 through the power connector 1202. The auxiliary power supply 1230 may be charged by the power PWR from the host 1100. In the case where the power PWR is not smoothly supplied from the host 1100, the auxiliary power supply 1230 may provide the power of the SSD 1200.

According to the present disclosure, an operating speed of a storage device may be improved by controlling control signals used to identify a command and data.

While the inventive concept(s) of the present disclosure have been described with reference to exemplary embodiments thereof, it will be apparent to those of ordinary skill in the art that various changes and modifications may be made thereto without departing from the spirit and scope of the present disclosure as set forth in the following claims.

What is claimed is:

1. A method of operating a controller which controls a nonvolatile memory device, the method comprising:
simultaneously enabling a command latch enable signal, an address latch enable signal, and a write enable signal;
transmitting a plurality of data signals including a command and an address to the nonvolatile memory device in synchronization starting with a first rising edge of the enabled write enable signal, wherein a number of DQ lines through which the plurality of data signals are transmitted is greater than a number of bits of each of the plurality of data signals;
disabling the command latch enable signal after the command is transmitted; and
disabling the address latch enable signal and the write enable signal after the address is transmitted.

2. The method of claim 1, wherein the controller transmits the command to the nonvolatile memory device at a first cycle that includes a first rising edge of the write enable signal.

3. The method of claim 2, wherein the controller further transmits a command end signal indicating that transmission of the command ends, at the first cycle.

4. The method of claim 3, wherein the controller transmits the command to the nonvolatile memory device through a first DQ line of the DQ lines, and
wherein the controller transmits the command end signal to the nonvolatile memory device through a second DQ line of the DQ lines.

5. The method of claim 1, wherein the DQ lines are divided into a command channel through which the command is transmitted and an address channel through which the address is transmitted.

6. The method of claim 5, wherein the controller transmits the command to the nonvolatile memory device through the command channel at a first cycle that includes a first rising edge of the write enable signal, and
wherein the controller transmits the address to the nonvolatile memory device through the address channel at the first cycle.

7. The method of claim 1, wherein the command latch enable signal includes a first command latch enable signal and a second command latch enable signal,
wherein the address latch enable signal includes a first address latch enable signal and a second address latch enable signal,
wherein the first command latch enable signal and the first address latch enable signal are used to latch a signal transmitted through a first DQ line of the DQ lines, and
wherein the second command latch enable signal and the second address latch enable signal are used to latch a signal transmitted through a second DQ line of the DQ lines.

8. The method of claim 1, wherein the command latch enable signal is enabled at a first cycle that includes a first rising edge of the enabled write enable signal, and wherein the address latch enable signal is enabled at a second cycle that includes a second rising edge of the enabled write enable signal.

9. The method of claim 8, wherein the controller transmits the command to the nonvolatile memory device at the first cycle, and
wherein the controller transmits the address to the nonvolatile memory device at the second cycle.

10. A method of operating a controller which controls a nonvolatile memory device, the method comprising:
enabling a write enable signal;
transmitting a first control signal that indicates a command or an address directed to the nonvolatile memory device;
transmitting a second control signal that indicates the command to the nonvolatile memory device;
transmitting a plurality of data signals including the command and the address to the nonvolatile memory device in synchronization starting with a first rising edge of the enabled write enable signal, wherein a number of DQ lines through which the plurality of data signals are transmitted is greater than a number of bits of each of the plurality of data signals;
disabling the second control signal after the command is transmitted; and
disabling the first control signal after the command and the address are transmitted.

11. The method of claim 10, wherein the command is transmitted in a first interval in which the first control signal is at logical high and the second control signal is at logical high, and
wherein the address is transmitted in a second interval in which the first control signal is at logical high and the second control signal is at logical low.

12. The method of claim 11, wherein the number of the bits of each of the plurality of data signals is 8, and the number of the DQ lines is a multiple of 8.

13. The method of claim 11, wherein
the number of the bits of each of the plurality of data signals is 7, and the number of the DQ lines is a multiple of 7.

14. The method of claim 10, wherein the DQ lines are divided into a command channel through which the command is transmitted and an address channel through which the address is transmitted.

15. The method of claim 14, wherein the controller transmits the command to the nonvolatile memory device through the command channel at a first cycle that includes a first rising edge of the write enable signal, and
wherein the controller transmits the address to the nonvolatile memory device through the address channel at the first cycle.

16. A storage device, comprising:
a nonvolatile memory device; and
a controller configured to simultaneously enable a command latch enable signal, an address latch enable signal, and a write enable signal so as to be transmitted to the nonvolatile memory device and to transmit a plurality of data signals including a command and an address to the nonvolatile memory device in synchronization starting with a first rising edge of the enabled write enable signal, wherein a number of DQ lines through which the plurality of data signals are transmitted is greater than a number of bits of each of the plurality of data signals,
wherein the controller disables the command latch enable signal after the command is transmitted and disables the address latch enable signal and the write enable signal after the address is transmitted.

17. The storage device of claim 16, wherein the controller transmits the command to the nonvolatile memory device at a first cycle that includes a first rising edge of the write enable signal.

18. The storage device of claim 17, wherein the controller further transmits a command end signal indicating that transmission of the command ends, at the first cycle.

19. The storage device of claim 18, wherein the controller transmits the command to the nonvolatile memory device through a first DQ line of the DQ lines, and
wherein the controller transmits the command end signal to the nonvolatile memory device through a second DQ line of the DQ lines.

20. The storage device of claim 16, wherein the DQ lines are divided into a command channel through which the command is transmitted and an address channel through which the address is transmitted,
wherein the controller transmits the command to the nonvolatile memory device through the command channel at a first cycle that includes a first rising edge of the write enable signal, and
wherein the controller transmits the address to the nonvolatile memory device through the address channel at the first cycle.

* * * * *